US012813036B2

(12) United States Patent
Liu et al.

(10) Patent No.: US 12,813,036 B2
(45) Date of Patent: Nov. 24, 2026

(54) DISPLAY PANEL, DISPLAY DEVICE, AND METHOD FOR PREPARING DISPLAY PANEL

(71) Applicant: Tianma Advanced Display Technology Institute (Xiamen) Co., Ltd., Xiamen (CN)

(72) Inventors: Cao Liu, Xiamen (CN); Xiaoxiang He, Xiamen (CN); Yingying Chen, Xiamen (CN)

(73) Assignee: Tianma Advanced Display Technology Institute (Xiamen) Co., Ltd, Xiamen (CN)

( * ) Notice: Subject to any disclaimer, the term of this patent is extended or adjusted under 35 U.S.C. 154(b) by 375 days.

(21) Appl. No.: 18/651,101

(22) Filed: Apr. 30, 2024

(65) Prior Publication Data

US 2024/0282893 A1 Aug. 22, 2024

(30) Foreign Application Priority Data

Dec. 29, 2023 (CN) ......................... 202311868063.4

(51) Int. Cl.
*H10H 20/84* (2025.01)
*H10H 20/854* (2025.01)
*H10W 90/00* (2026.01)
*H10H 20/01* (2025.01)

(52) U.S. Cl.
CPC .......... *H10H 20/854* (2025.01); *H10H 20/84* (2025.01); *H10W 90/00* (2026.01); *H10H 20/034* (2025.01); *H10H 20/0362* (2025.01)

(58) Field of Classification Search
CPC ............... H10H 20/854; H10H 20/034; H10H 20/0362; H10W 90/00
See application file for complete search history.

(56) References Cited

U.S. PATENT DOCUMENTS 10,276,838 B2 * 4/2019 Kim ..................... H10D 86/441
10,782,573 B2 * 9/2020 Park .................... G02F 1/13452

FOREIGN PATENT DOCUMENTS

CN 107818993 A 3/2018
CN 110504346 A 11/2019
CN 112186021 A 1/2021

* cited by examiner

*Primary Examiner* — Dale E Page
*Assistant Examiner* — Wilner Jean Baptiste
(74) *Attorney, Agent, or Firm* — KDW Firm PLLC

(57) ABSTRACT

Provided are a display panel and a display device. The display panel includes a display region, a substrate, an array layer, a light-emitting element, and an inorganic encapsulation layer. The light-emitting element is located on the side of the array layer facing away from the substrate. The array layer includes a groove and a driver circuit. The driver circuit is at least partially located in the display region. The inorganic encapsulation layer is located on the side of the light-emitting element facing away from the substrate and at least partially covers the groove. In a first direction, the minimum distance from the groove to an edge of the display panel is less than the minimum distance from the driver circuit to the edge of the display panel. The first direction is a direction in which the display region points to the edge of the display panel.

20 Claims, 15 Drawing Sheets

DISPLAY PANEL, DISPLAY DEVICE, AND METHOD FOR PREPARING DISPLAY PANEL

This application claims priority to Chinese Patent Application No. 202311868063.4 filed Dec. 29, 2023, the disclosure of which is incorporated herein by reference in its entirety.

TECHNICAL FIELD

The present application relates to the field of display technology and, in particular, to a display panel, a display device, and a method for preparing the display panel.

BACKGROUND

When a display device adopts a splicing method to splice multiple display panels together for common display, to reduce the impact of the joint of the display panels on the display effect, the display panel is in a form of a narrow bezel or no bezel. However, water, oxygen, or static electricity may enter from the sides of a display panel and enter the pixel circuit of the display panel, thereby affecting the display effect.

SUMMARY

Embodiments of the present application provide a display panel, a display device, and a method for preparing the display panel. Thus, water and oxygen can be reduced from entering the display panel, thereby improving the display effect.

In a first aspect, an embodiment of the present application provides a display panel. The display panel includes a display region. The display panel also includes a substrate, an array layer, a light-emitting element, and an inorganic encapsulation layer. The light-emitting element is located on the side of the array layer facing away from the substrate. The array layer includes a groove and a driver circuit. The driver circuit is at least partially located in the display region. The inorganic encapsulation layer is located on the side of the light-emitting element facing away from the substrate. The inorganic encapsulation layer at least partially covers the groove. In a first direction, the minimum distance from the groove to an edge of the display panel is less than the minimum distance from the driver circuit to the edge of the display panel. The first direction is a direction in which the display region points to the edge of the display panel.

In a second aspect, an embodiment of the present application provides a display device. The display device includes the display panel provided in the embodiment of the first aspect of the present application.

In a third aspect, an embodiment of the present application provides a method for preparing the display panel. The method includes the following. The display panel includes a display region. The substrate is provided. The array layer is prepared on a side of the substrate. The array layer is prepared in the following manners: The driver circuit is prepared, and the groove is prepared. The driver circuit is at least partially located in the display region. The light-emitting element is prepared on the side of the array layer facing away from the substrate. The inorganic encapsulation layer is prepared on the side of the light-emitting element facing away from the substrate. The inorganic encapsulation layer at least partially covers the groove. In the first direction, the minimum distance from the groove to the edge of the display panel is less than the minimum distance from the driver circuit to the edge of the display panel. The first direction is the direction in which the display region points to the edge of the display panel.

BRIEF DESCRIPTION OF DRAWINGS

To illustrate technical solutions in embodiments of the present application more clearly, drawings used in the embodiments of the present application are briefly described below. Apparently, the drawings described below illustrate only part of the embodiments of the present application, and those of ordinary skill in the art may obtain other drawings according to these drawings on the premise that no creative work is done.

REFERENCE LIST

Figure 1:
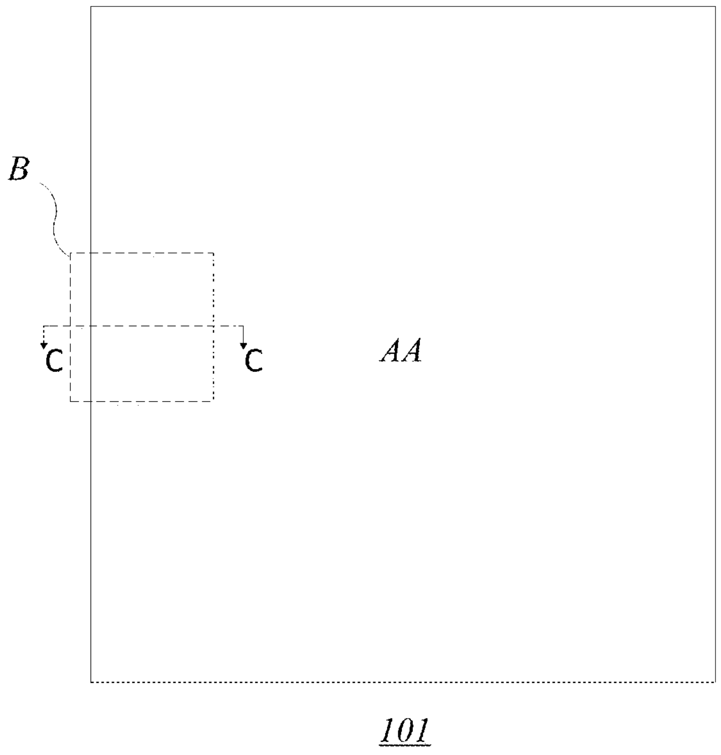
FIG. 1 is a diagram of a display panel according to an embodiment of the present application.

100 display device
 101 display panel
 1 substrate
 2 array layer
 21 groove
 22 driver circuit
 23 planarization layer
 24 inorganic insulating layer
 25 metal layer
 26 pixel circuit
 27 signal connection line
 3 light-emitting element
 31 first pixel unit
 32 second pixel unit
 33 floating light-emitting element
 4 inorganic encapsulation layer
 51 first bank
 52 second bank
 61 first light-shielding layer
 62 second light-shielding layer
 63 third light-shielding layer
 64 fourth light-shielding layer
 A1 first direction
 AA display region

DETAILED DESCRIPTION

Features and example embodiments in various aspects of the present application are described hereinafter in detail. Numerous specific details are set forth in the detailed description below to provide a thorough understanding of the present application. However, to those skilled in the art, apparently, the present application may be implemented with no need for some of these specific details. The description of the embodiments hereinafter is intended merely to provide a better understanding of the present application through examples of the present application.

It is to be noted that if not in collision, the embodiments and features therein in the present application can be combined with each other. The embodiments are described in detail below with reference to the drawings.

Relationship terms such as first and second are used merely to distinguish one entity or operation from another. It does not necessarily require or imply any such actual relationship or order between these entities or operations. Furthermore, the term "comprising", "including" or any other variant thereof is intended to encompass a non-exclusive inclusion so that a process, method, article, or device that includes a series of elements not only includes the expressly listed elements but may also include other elements that are not expressly listed or are inherent to such process, method, article, or device. In the absence of more restrictions, the elements defined by the statement "including . . . " do not exclude the presence of additional identical elements in the process, method, article, or device that includes the elements.

It is to be understood that when the structure of a component is described and a layer or region is referred to as "on" or "above" another layer or region, it may refer to that the layer or region is directly located on another layer or region, or other layers or regions are included between the layer or region and another layer or region. Moreover, if the component is turned over, the layer or region is located "below" or "underneath" another layer or region.

Additionally, the term "and/or" used herein merely describes the association relationships between associated objects and indicates that three relationships may exist. For example, A and/or B may indicate three cases: A exists alone, A and B both exist, and B exists alone. Additionally, the character "/" used herein typically indicates that the front and rear associated objects are in an "or" relationship.

It is to be understood that in the embodiments of the present application, "B corresponding to A" refers to that B is associated with A, and B may be determined according to A. It is to be further understood that determining B according to A does not refer to determining B according to A alone, but may also be determining B according to A and/or other information.

The applicant finds that a spliced display device may splice multiple display panels together for display and emitting light. The size of the non-display region of a single display panel determines the size of the joint between two adjacent display panels. To reduce the joint, a display panel may be in a form of no bezel. That is, the display panel almost only has a display region. Generally, a driver circuit that is disposed in the non-display region may also be disposed in the display region. When the display panel is prepared, an inorganic encapsulation layer usually covers only the array layer of the display panel. However, it is difficult for the inorganic encapsulation layer to cover the sides of the display panel. As a result, water and oxygen may enter the array layer of the display panel from the sides of the display panel and damage the pixel circuit or driver circuit structure, thereby affecting the display effect.

In view of the preceding problems, the applicant proposes a display panel, a display device, and a method for preparing the display panel. The display panel includes a display region, a substrate, an array layer, a light-emitting element, and an inorganic encapsulation layer. The driver circuit of the array layer is located in the display region to increase the area ratio of the display region. In a first direction, the minimum distance from a groove to an edge of the display panel is less than the minimum distance from the driver circuit to the edge of the display panel. The groove encloses the driver circuit inside. The inorganic encapsulation layer covers the groove and encapsulates the region surrounded by the groove. In this manner, water and oxygen can be reduced from entering the region surrounded by the groove, and the impact of the water and oxygen on the array layer is reduced. Thus, the display effect of the display panel of the embodiments of the present application is improved.

Figure 2:
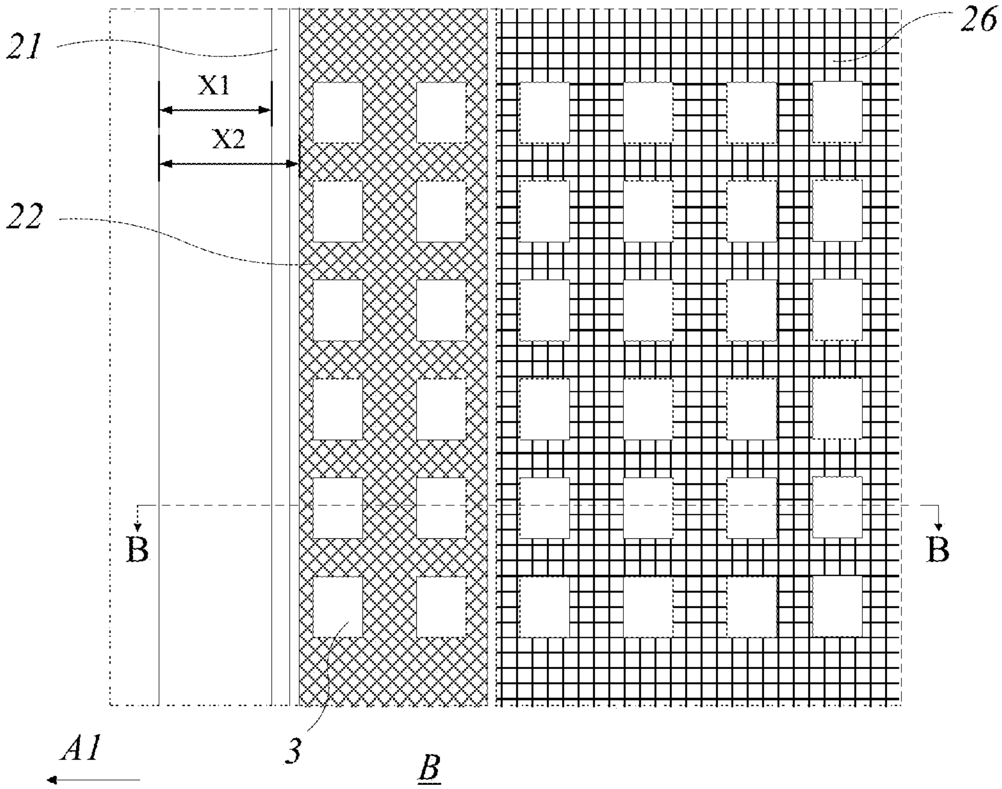
FIG. 2 is an enlarged partial view of region B of the display panel of FIG. 1 according to an embodiment of the present application.
Figure 3:
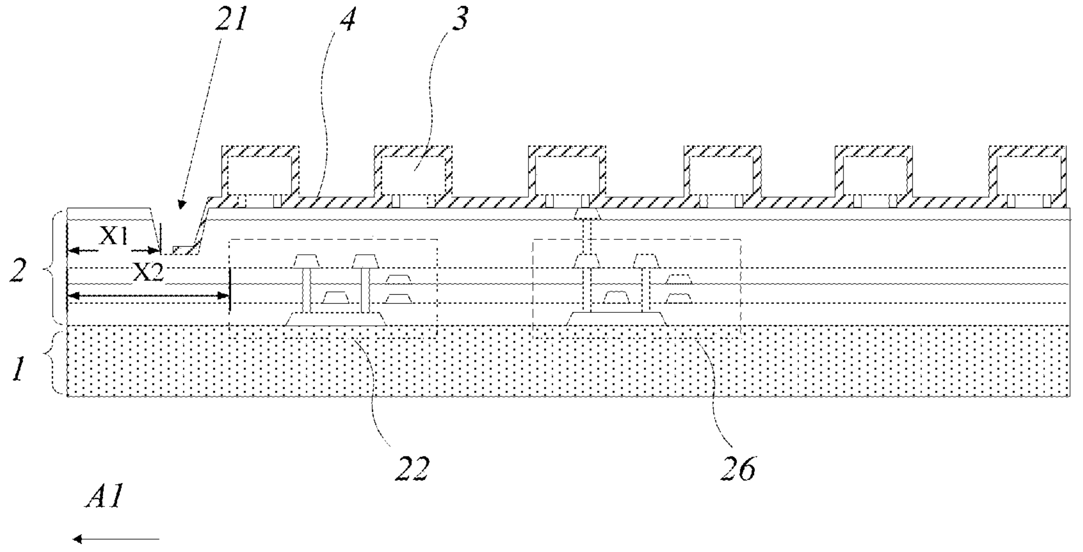
FIG. 3 is a section view taken along section line B-B of FIG. 2 to illustrate region B of the display panel of FIG. 2 according to an embodiment of the present application.

FIG. 1 is a diagram of a display panel according to an embodiment of the present application. FIG. 2 is an enlarged partial view of region B of the display panel of FIG. 1 according to an embodiment of the present application. FIG. 3 is a section view taken along section line B-B of FIG. 2 to illustrate region B of the display panel of FIG. 2 according to an embodiment of the present application.

Referring to FIGS. 1 to 3, the present application provides a display panel 101. The display panel 101 includes a display region AA. The display panel 101 also includes a substrate 1, an array layer 2, a light-emitting element 3, and an inorganic encapsulation layer 4. The light-emitting element 3 is located on the side of the array layer 2 facing away from the substrate 1. The array layer 2 includes a groove 21 and a driver circuit 22. The driver circuit 22 is at least partially located in the display region AA. The inorganic encapsulation layer 4 is located on the side of the light-emitting element facing away from the substrate 1. The inorganic encapsulation layer 4 at least partially covers the groove 21. In a first direction A1, the minimum distance X1 from the groove 21 to an edge of the display panel 101 is less than the minimum distance X2 from the driver circuit 22 to the edge of the display panel 101. The first direction A1 is a direction in which the display region AA points to the edge of the display panel 101.

The display panel 101 of this embodiment of the present application may be in a form of no bezel and generally belongs to the display region AA. When the display panel 101 of this embodiment of the present application is used for a spliced display device 100, the size of the joint between display panels 101 may be reduced.

The substrate 1 may be formed of a polymer material such as glass, polyimide (PI), polycarbonate (PC), polyethersulfone (PES), polyester polyethylene terephthalate (PET), polyethylene naphthalate (PEN), polyarylates (PAR), or glass-fibre-reinforced plastic (FRP). The substrate 1 may be transparent, translucent, or opaque.

The array layer 2 is located on a side of the substrate 1. The light-emitting element 3 is located on the side of the array layer 2 facing away from the substrate 1. The driver circuit 22 of the array layer 2 is electrically connected to the pixel circuit 26. The driver circuit 22 is configured to provide a signal for the pixel circuit 26. The pixel circuit 26 is electrically connected to the light-emitting element. The pixel circuit 26 provides a drive current to the light-emitting element 3. The driver circuit 22 is disposed in the display region AA. Thus, the occupation of the non-display region of the display panel 101 of this embodiment of the present application by the driver circuit 22 may be reduced, so that the joint of the spliced display device using the display panel 101 of this embodiment of the present application is reduced, thereby improving the display effect.

It is to be noted that in this embodiment of the present application, the light-emitting element 3 may be one or more of an organic light-emitting diode (OLED), a micro light-emitting diode (microLED), or a mini light-emitting diode (miniLED). For ease of understanding, in this embodiment of the present application, description is given by using an example in which the light-emitting element 3 may be a micro light-emitting diode. The driver circuit 22 and the pixel circuit 26 may include at least one thin-film transistor (TFT) and a capacitor. In this embodiment of the present application, a description is given by using an example in which the thin-film transistor is a top-gate transistor. The thin-film transistor includes an active layer, a gate insulating layer located on the active layer, a gate of the thin-film transistor located on the gate insulating layer, and an interlayer insulating layer on the gate. The active layer includes a source region and a drain region that are formed by doping n-type impurity ions or p-type impurity ions and a channel region between the source region and the drain region. The interlayer insulating layer may be formed of an insulating inorganic layer such as silicon oxide or silicon nitride. The interlayer insulating layer may be formed of an insulating organic layer. The source electrode and the drain electrode of the thin-film transistor are located on the interlayer insulating layer. The source electrode and the drain electrode are electrically connected (or bonded) to the source region and the drain region through contact holes respectively. Contact holes are formed by selectively removing the gate insulating layer and the interlayer insulating layer. It is to be noted that for ease of understanding, in the drawings of the specification of the embodiments of the present application, only a thin-film transistor and a capacitor are drawn for the driver circuit 22 and the pixel circuit 26. The number of thin-film transistors and capacitors in the driver circuit 22 and the pixel circuit 26 is not limited to one.

The array layer 2 also includes a groove 21. In the first direction A1, the minimum distance X1 from the groove 21 to the edge of the display panel 101 is less than the minimum distance X2 from the driver circuit 22 to the edge of the display panel 101. That is, in a direction perpendicular to the thickness direction of the display panel 101 in this embodiment of the present application, the groove 21 and the driver circuit 22 are observed. The groove 21 is located between the driver circuit 22 and the edge of the display panel 101. When water and oxygen invade the array layer 2 from a side of the display panel 101 of this embodiment of the present application, the groove 21 blocks at least a part of the array layer 2 and blocks the invasion path of water and oxygen to a certain extent. In this manner, the further invasion of water and oxygen is blocked, and the impact of the water and oxygen on the driver circuit 22 is reduced. It is to be noted that the first direction A1 is perpendicular to the edge of the display panel 101 and is parallel to the plane where the display panel 101 is located. The first direction A1 points to the edge of the display panel 101 from the display region AA. If a non-display region is disposed on the periphery of the display region AA, the first direction A1 may also be considered as a direction from the display region AA to the non-display region.

The inorganic encapsulation layer 4 is located on the side of the light-emitting element facing away from the substrate 1. The inorganic encapsulation layer 4 at least partially covers the groove 21 and encapsulates the region located on the side of the groove 21 facing away from the edge of the display panel 101. That is, the inorganic encapsulation layer 4 encapsulates the driver circuit 22. The inorganic encapsulation layer 4 is made of an inorganic material and has a good water and oxygen isolation capability. When the inorganic encapsulation layer 4 covers the bottom of the groove 21, the inorganic encapsulation layer 4 may perform water and oxygen isolation on the region surrounded by the groove 21. Even if a new crack appears at the position of the groove 21, the inorganic encapsulation layer 4 can also prevent water and oxygen from continuing to invade along the crack of the groove 21. Thus, the inorganic encapsulation layer 4 may prevent water and oxygen from entering the region located on the side of the groove 21 facing away from the edge of the display panel 101, thereby weakening the impact of the water and oxygen on the driver circuit 22. Thus, the display panel 101 of this embodiment of the present application has a good display effect.

It is to be noted that in a section perpendicular to the extension direction of the groove 21, the section shape of the groove 21 may be an inverted trapezoid. The inorganic encapsulation layer 4 should be able to cover at least a part of the bottom of the groove 21, so that the lower film exposed at the bottom of the groove 21 contacts the inorganic encapsulation layer 4, thereby reducing the entry of water and oxygen. In some embodiments, the inorganic encapsulation layer 4 may also cover at least a part of the sidewall of the groove 21. In other embodiments, the inorganic encapsulation layer 4 may cover the entire groove 21.

Figure 4:
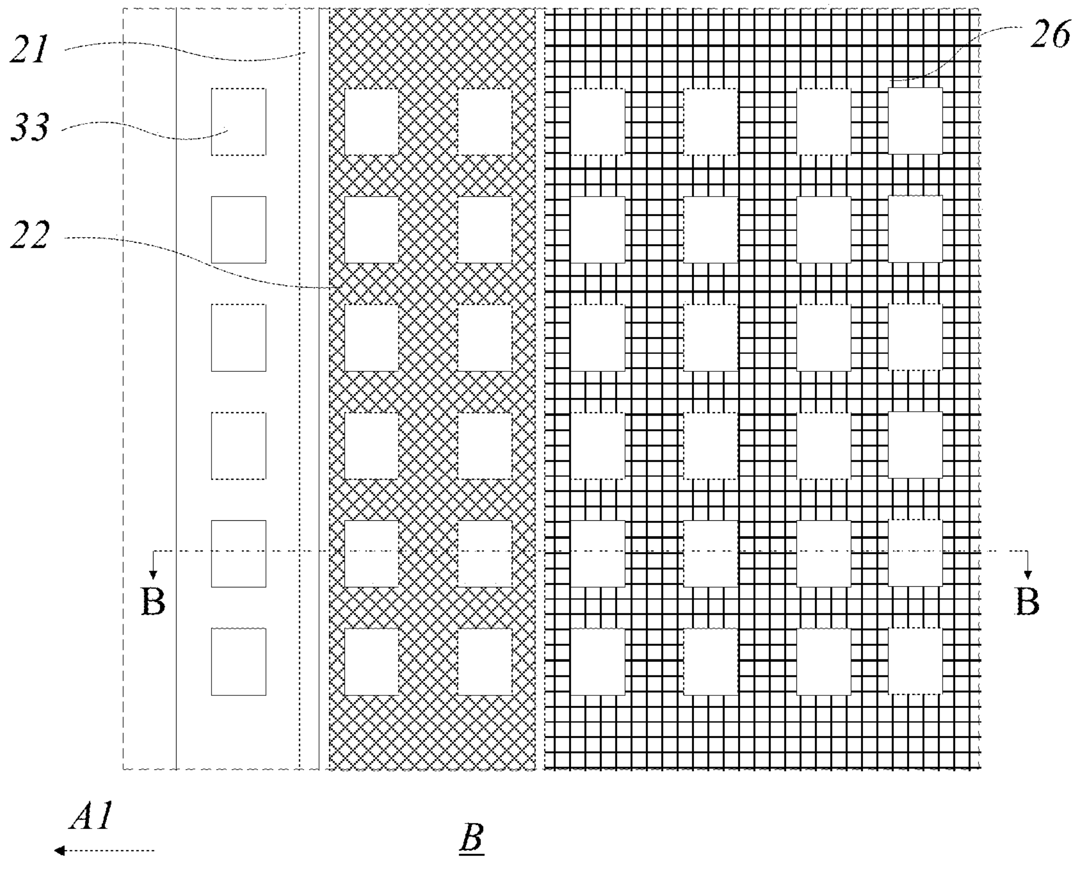
FIG. 4 is another enlarged partial view of region B of the display panel of FIG. 1 according to an embodiment of the present application.
Figure 5:
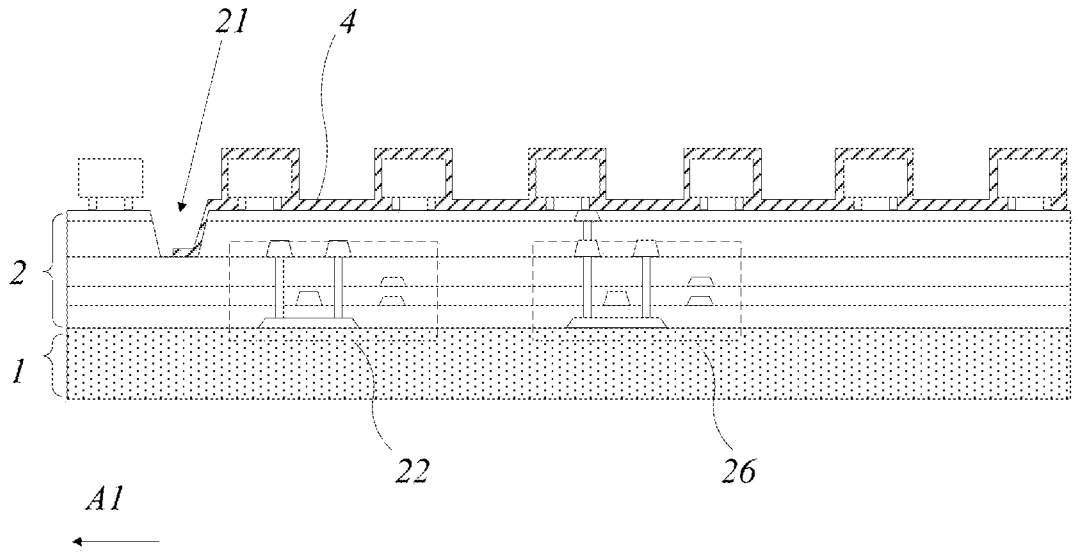
FIG. 5 is another section view taken along section line B-B of FIG. 4 to illustrate region B of the display panel of FIG. 4 according to an embodiment of the present application.

FIG. 4 is an enlarged partial view of region B of the display panel of FIG. 1 according to an embodiment of the present application. FIG. 5 is another section view taken along section line B-B of FIG. 4 to illustrate region B of the display panel of FIG. 4 according to an embodiment of the present application.

In an embodiment, referring to FIGS. 4 to 5, the light-emitting element includes a floating light-emitting element 33. In the direction perpendicular to the plane where the substrate 1 is located, the orthographic projection of at least one floating light-emitting element 33 is located between the orthographic projection of the driver circuit 22 and the orthographic projection of the edge of the display panel 101.

In this embodiment of the present application, multiple light-emitting elements are disposed in the entire display region AA. The floating light-emitting element 33 has the same structure as other light-emitting elements. In the direction perpendicular to the plane where the substrate 1 is located, the orthographic projection of the floating light-emitting element 33 is located between the orthographic projection of the driver circuit 22 and the orthographic projection of the edge of the display panel 101. That is, the floating light-emitting element 33 is more adjacent to the edge of the display panel 101 than the driver circuit 22. The floating light-emitting element 33 may still receive the signal of the pixel circuit 26 and display and emit light. As a part of the display region AA, the region used for display and emitting light is more adjacent to the edge of the display panel 101. Thus, the width of the joint of the spliced display device using the display panel 101 of this embodiment of the present application may be further reduced. In the direction perpendicular to the plane where the substrate 1 is located, the orthographic projection of the driver circuit 22 does not overlap the orthographic projection of the floating light-emitting element 33, so that a certain distance is left between the driver circuit 22 and the display panel 101 to facilitate the disposition of the groove 21. Thus, the inorganic encapsulation layer 4 can encapsulate the driver circuit 22, so that water and oxygen are prevented from affecting the driver circuit 22. In this embodiment of the present application, the floating light-emitting element 33 may use an inorganic light-emitting diode and is less sensitive to water and oxygen than the driver circuit 22. Thus, the floating light-emitting element 33 is located between the groove 21 and the edge of the display panel 101. Even if there is a risk of the invasion of water and oxygen, there is no apparent impact on the floating light-emitting element 33.

Figure 6:
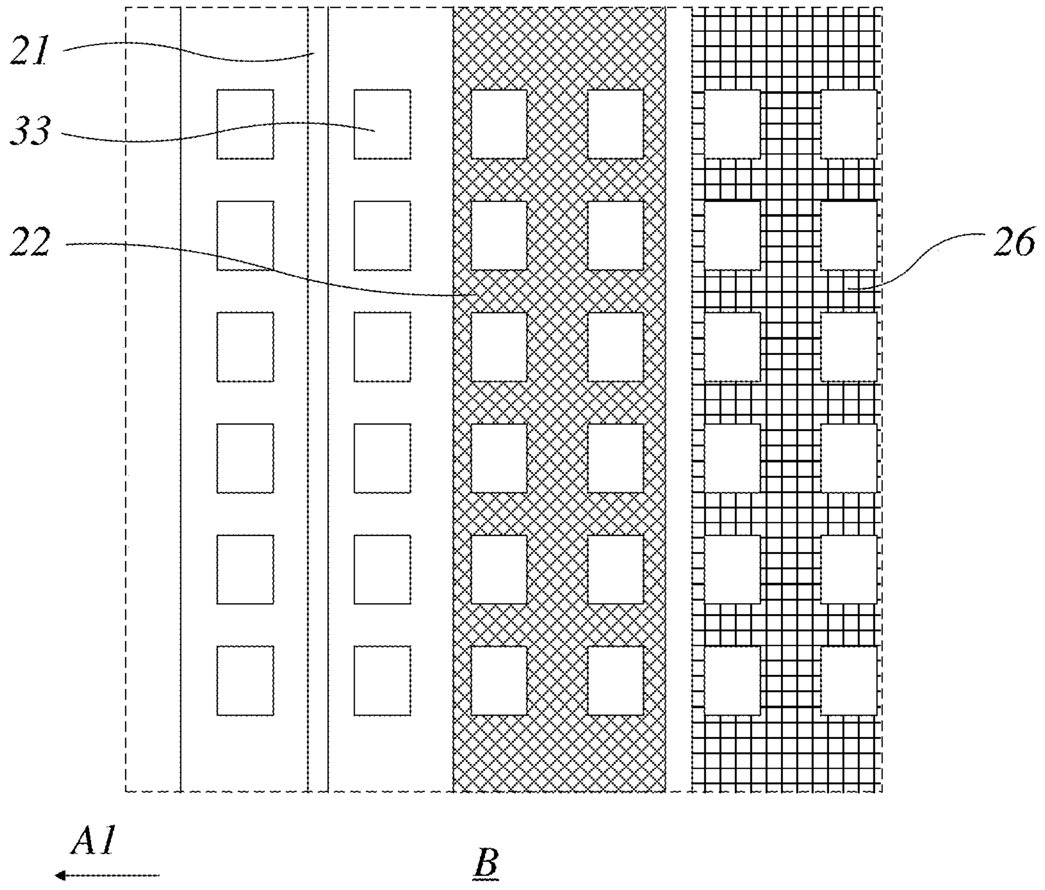
FIG. 6 is another enlarged partial view of region B of the display panel of FIG. 1 according to an embodiment of the present application.

FIG. 6 is another enlarged partial view of region B of the display panel of FIG. 1 according to an embodiment of the present application.

In some embodiments, referring to FIG. 6, at least one floating light-emitting element 33 is located between the edge of the display panel 101 and the groove 21.

In the direction perpendicular to the plane where the substrate 1 is located, the orthographic projection of the floating light-emitting element 33 is located between the orthographic projection of the groove 21 and the orthographic projection of the edge of the display panel 101. Thus, the region between the groove 21 and the edge of the display panel 101 can also be a part of the display region AA for display and emitting light. It is to be noted that the groove 21, the light-emitting element, and the driver circuit 22 may be located on different layers, that is, the three may be located on different planes. In this embodiment, the description in which at least one floating light-emitting element 33 is located between the edge of the display panel 101 and the groove 21 may be understood as description from a top-view perspective.

Figure 7:
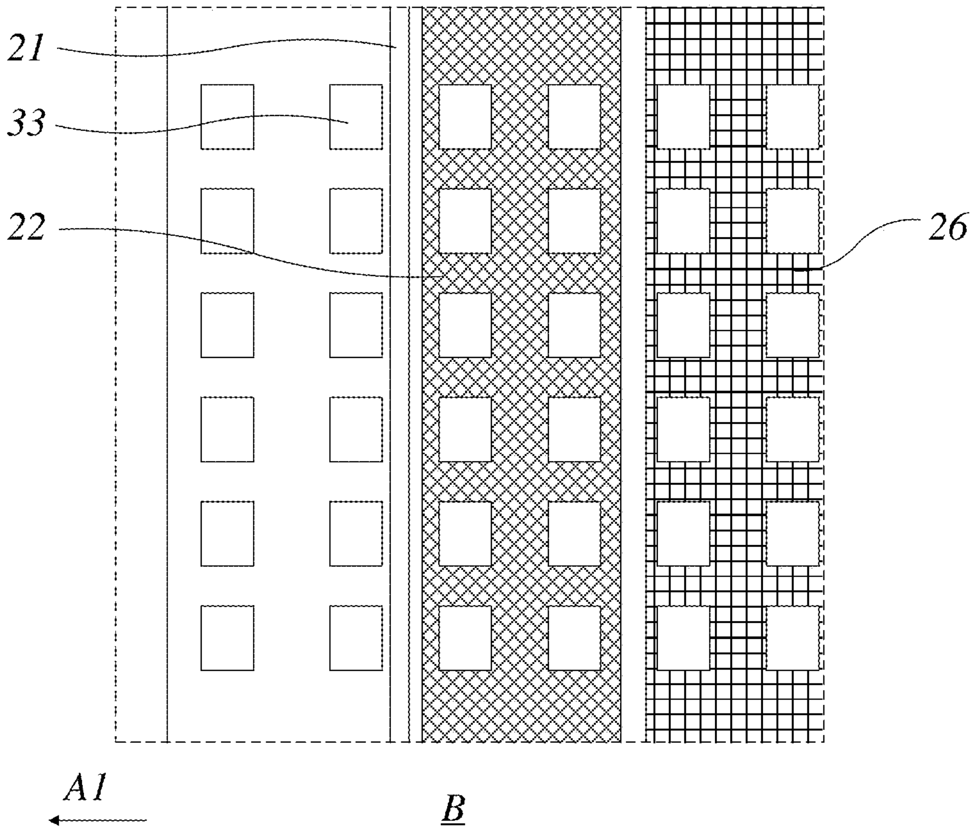
FIG. 7 is another enlarged partial view of region B of the display panel of FIG. 1 according to an embodiment of the present application.

FIG. 7 is another enlarged partial view of region B of the display panel of FIG. 1 according to an embodiment of the present application.

In an embodiment, referring to FIG. 7, the floating light-emitting element 33 is not disposed between the groove 21 and the driver circuit 22.

When the groove 21 is located between two floating light-emitting elements 33, at least one floating light-emitting element 33 is disposed between the groove 21 and the edge of the display panel 101, and at least one floating light-emitting element 33 is disposed between the groove 21 and the driver circuit 22. In this manner, the space between the floating light-emitting elements 33 is fully utilized, and the impact of disposition of the groove 21 on the display effect of the display panel 101 is reduced. At the same time, since at least one floating light-emitting element 33 is disposed between the groove 21 and the driver circuit 22, the distance between the groove 21 and the driver circuit 22 is increased. Even if a new crack is generated in the groove 21, the crack may also be used as the invasion path of water and oxygen. However, the time for water and oxygen to affect the driver circuit 22 can be increased, so that the service life of the display panel according to this embodiment of the present application can also be increased.

In an embodiment, the floating light-emitting element 33 is not disposed between the groove 21 and the driver circuit 22, so that the groove 21 is adjacent to the driver circuit 22 to improve the encapsulation effect of the inorganic encapsulation layer 4 on the driver circuit 22, and the impact of the groove 21 on the position of the floating light-emitting element 33 can also be reduced. Thus, light-emitting elements 3 including the floating light-emitting element 33 can be uniformly distributed in the display region AA, so that the display effect of the display panel 101 of this embodiment of the present application can be improved.

Figure 8:
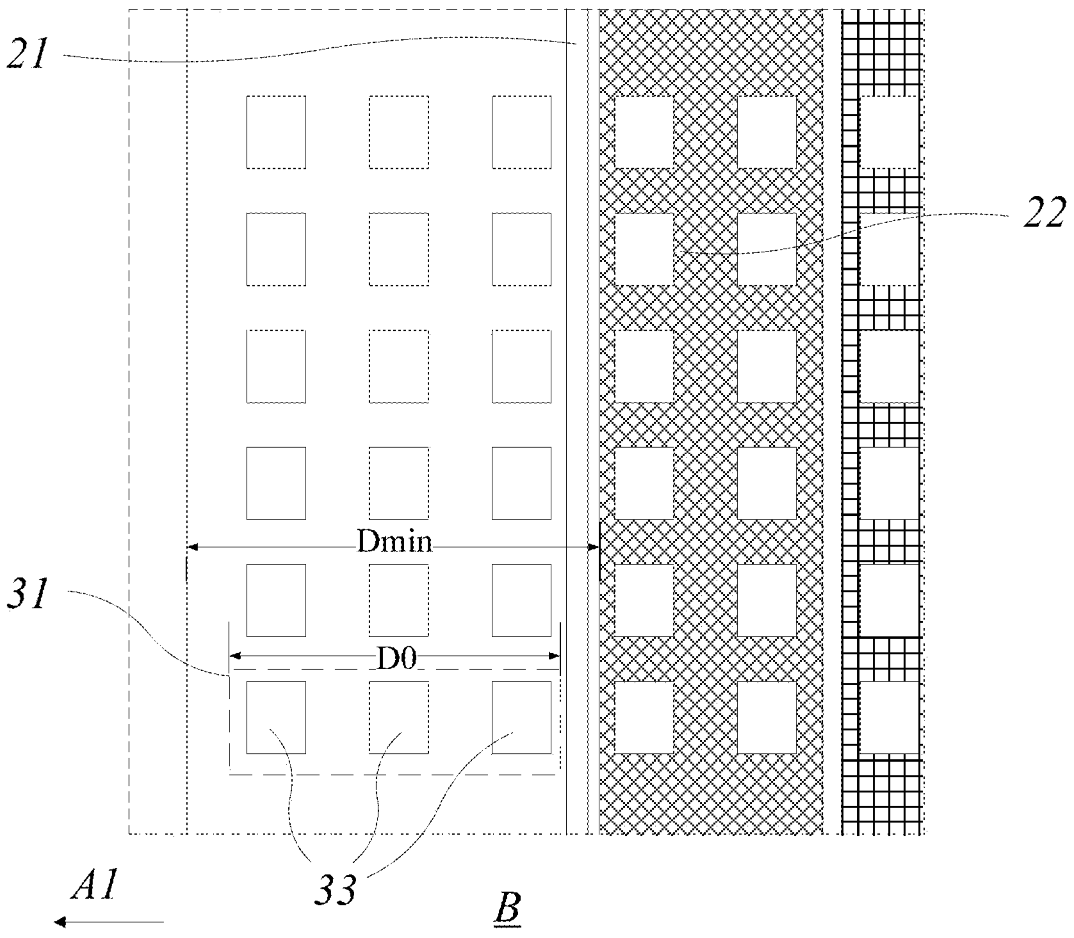
FIG. 8 is another enlarged partial view of region B of the display panel of FIG. 1 according to an embodiment of the present application.

FIG. 8 is another enlarged partial view of region B of the display panel of FIG. 1 according to an embodiment of the present application.

In an embodiment, referring to FIG. 8, in the first direction A1, at least one first pixel unit 31 is included between the edge of the display panel 101 and the driver circuit 22. The first pixel unit 31 includes floating light-emitting elements 33 of three different colors.

The first pixel unit 31 includes floating light-emitting elements 33 of three different colors, such as red, green, and blue floating light-emitting elements 33. The floating light-emitting elements 33 of three different colors may work together to emit light, so that the first pixel unit 31 displays different colors. At least one first pixel unit 31 is included between the edge of the display panel 101 and the driver circuit 22, so that the driver circuit 22 does not cause different floating light-emitting elements 33 of a single first pixel unit 31 to be apparently separated to ensure the mixed light effect of the floating light-emitting elements 33 of different colors of the first pixel unit 31.

In an embodiment, further referring to FIG. 5, in the first direction A1, the length of the first pixel unit 31 is D0, the minimum distance from the driver circuit 22 to the display panel 101 is Dmin, and Dmin≥n×D0. n is a positive integer.

In the first direction A1, the minimum distance Dmin from the driver circuit 22 to the display panel 101 is greater than an integer multiple of the length D0 of the first pixel unit 31. That is, there are an integer number of first pixel units 31 between the driver circuit 22 and the edge of the display panel 101, so that the driver circuit 22 does not cause different floating light-emitting elements 33 of a single first pixel unit 31 to be apparently separated to ensure the mixed light effect of the floating light-emitting elements 33 of different colors of the first pixel unit 31, and n=2, or n=3.

Figure 9:
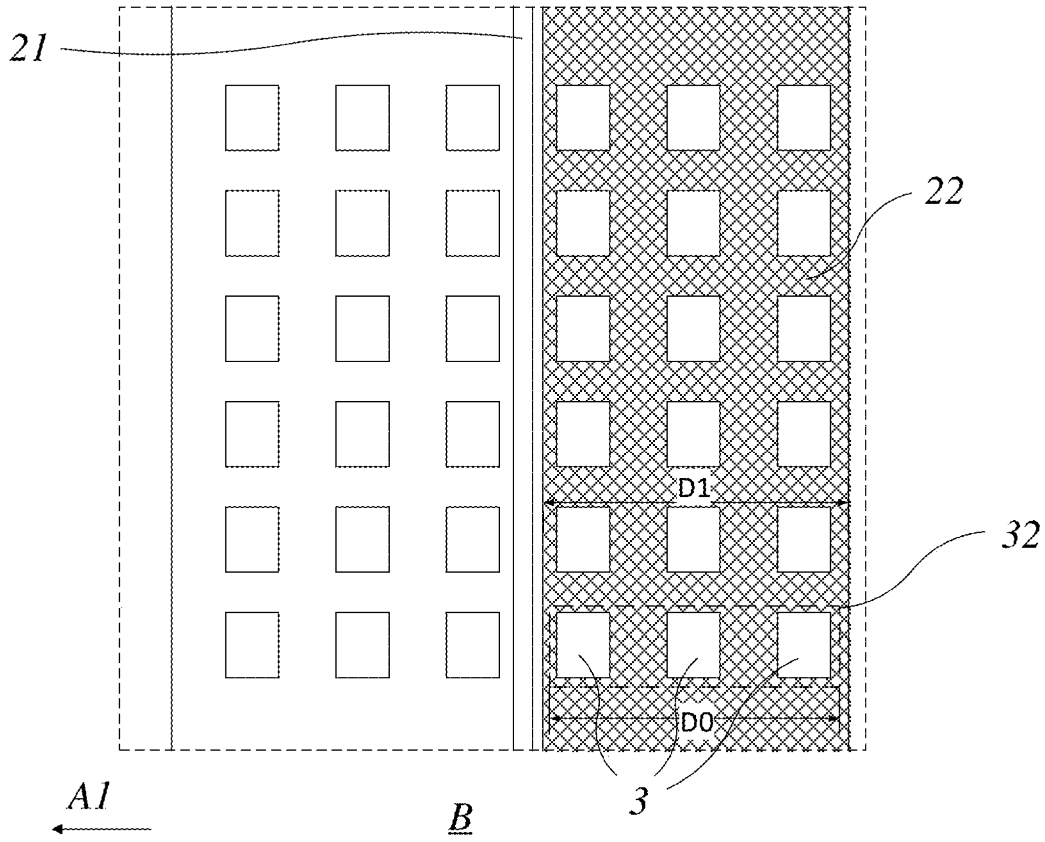
FIG. 9 is another enlarged partial view of region B of the display panel of FIG. 1 according to an embodiment of the present application.

FIG. 9 is another enlarged partial view of region B of the display panel of FIG. 1 according to an embodiment of the present application.

In an embodiment, referring to FIG. 9, the display panel 101 also includes a second pixel unit 32. The second pixel unit 32 includes three light-emitting elements of different colors. In the direction perpendicular to the substrate 1, the second pixel unit 32 partially overlaps the driver circuit 22. In the first direction A1, the length of the second pixel unit 32 is D1, the length of the driver circuit 22 is ΔD, and ΔD≥n×D1, wherein n≥1.

In this embodiment of the present application, the structure of the second pixel unit 32 is the same as the structure of the first pixel unit 31. The arrangement of the light-emitting elements of the second pixel unit 32 may be the same as the arrangement of the light-emitting elements of the first pixel unit 31, and the difference between the second pixel unit 32 and the first pixel unit 31 lies in different positions. The spacing between the light-emitting elements of the first pixel unit 31 and the spacing between the light-emitting elements of the second pixel unit 32 may be equal or not equal. In the first direction A1, the length ΔD of the driver circuit 22 may be greater than the length D1 of the second pixel unit 32. The driver circuit 22 is located above the second pixel unit 32, and at least one second pixel unit 32 is disposed.

Figure 10:
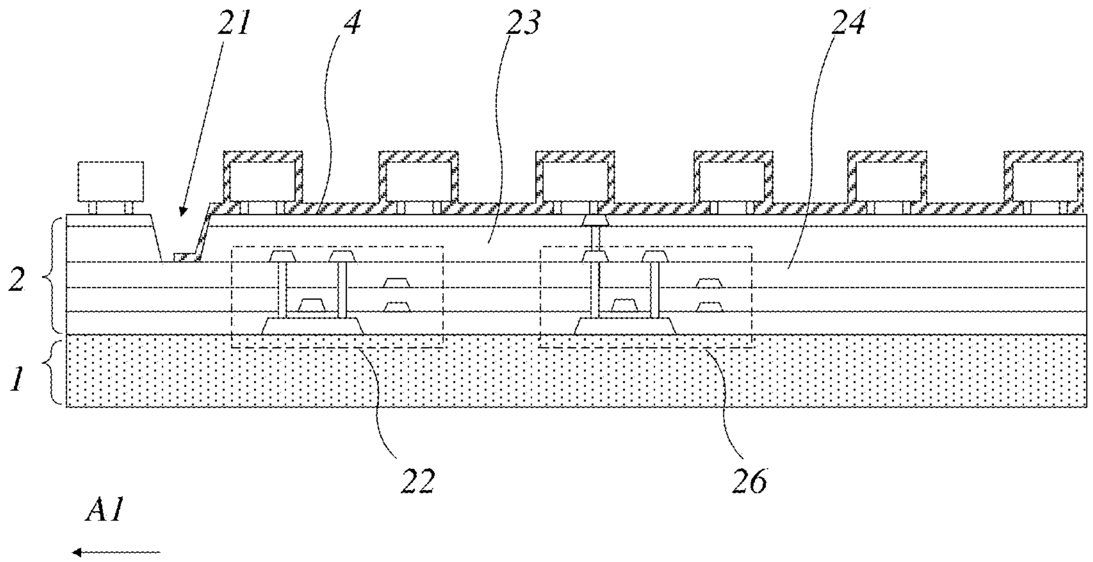
FIG. 10 is another section view taken along section line B-B of FIG. 4 to illustrate region B of the display panel of FIG. 4 according to an embodiment of the present application.
Figure 11:
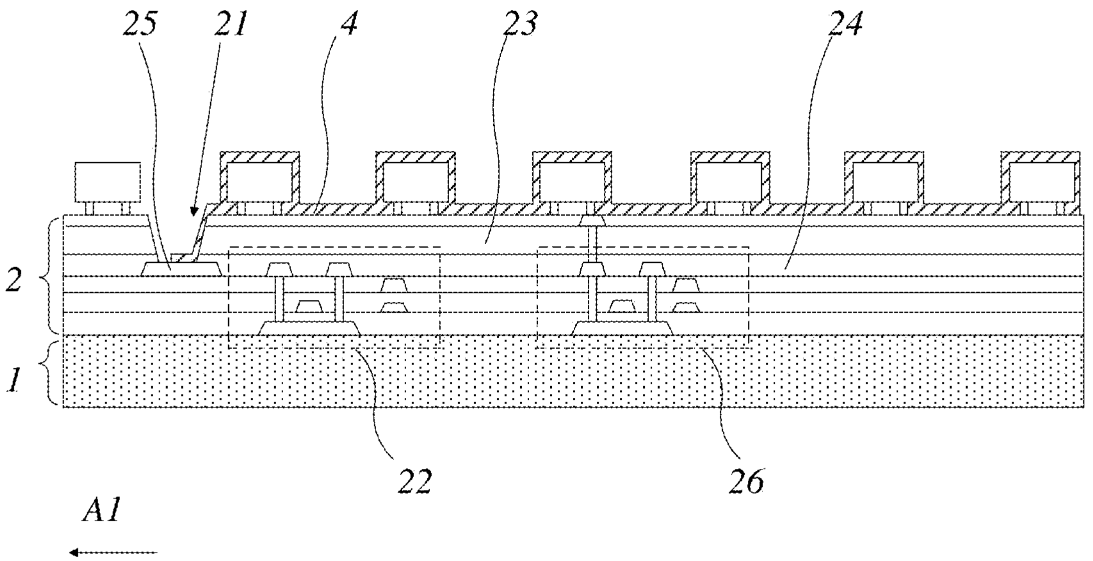
FIG. 11 is another section view taken along section line B-B of FIG. 4 to illustrate region B of the display panel of FIG. 4 according to an embodiment of the present application.

FIG. 10 is another section view taken along section line B-B of FIG. 4 to illustrate region B of the display panel of FIG. 4 according to an embodiment of the present application. FIG. 11 is another section view taken along section line B-B of FIG. 4 to illustrate region B of the display panel of FIG. 4 according to an embodiment of the present application.

In an embodiment, referring to FIGS. 10 and 11, the array layer 2 includes a planarization layer 23. The groove 21 penetrates the planarization layer 23.

Considering that the planarization layer 23 is disposed on the side of the driver circuit 22 facing away from the substrate 1, and the driver circuit 22 includes a capacitor and/or a thin-film transistor (TFT), a plane cannot be formed on the side of the driver circuit 22 facing away from the substrate 1. The planarization layer 23 has a planarization effect, so that a plane is formed on the side of the planarization layer 23 facing away from the substrate 1. Thus, other structures, such as the connection terminal of the light-emitting element 3, are formed on the side of the planarization layer 23 facing away from the substrate 1. The planarization layer 23 may include an organic layer of acrylic, polyimide (PI), or benzocyclobutene (BCB). Since the planarization layer 23 is made of organic materials, its water and oxygen barrier capability is poor. Thus, the groove 21 penetrates the planarization layer 23, and the inorganic encapsulation layer 4 covers the groove 21, so that the inorganic encapsulation layer 4 can reduce the entry of water and oxygen from the planarization layer 23 to reduce the impact of the water and oxygen on the driver circuit 22. Thus, the display effect of the display panel of the embodiments of the present application is improved.

In an embodiment, further referring to FIGS. 7 and 8, the array layer 2 also includes a metal layer 25 and an inorganic insulating layer 24. The inorganic encapsulation layer 4 contacts at least one of the metal layer 25 or the inorganic insulating layer 24 at the bottom of the groove 21 adjacent to the substrate 1.

The groove 21 penetrates the planarization layer 23, so that the film under the planarization layer 23 is exposed at the bottom of the groove 21. The metal layer 25 or the inorganic insulating layer 24 of the array layer 2 is made of an inorganic material, and densification is apparently better than the planarization layer 23. Thus, the metal layer 25 or the inorganic insulating layer 24 has a good water and oxygen barrier capability. The groove 21 penetrates the planarization layer 23. At least one of the metal layer 25 or the inorganic insulating layer 24 is exposed at the bottom of the groove 21 and directly contacts the inorganic encapsulation layer 4. Thus, the planarization layer 23 is isolated, and water and oxygen is prevented from affecting the driver circuit 22 by using the planarization layer 23 as an invasion path. In addition, the metal layer 25 or the inorganic insulating layer 24 can have good contact performance with the inorganic encapsulation layer 4 and also reduce the possibility of the invasion of water and oxygen from the connection between the inorganic encapsulation layer 4 and the metal layer 25 or the inorganic insulating layer 24. In this manner, the entry of water and oxygen into the side of the groove 21 facing away from the display panel 101 is further reduced. Thus, the water and oxygen barrier capability is improved, and the display effect of the display panel 101 of the embodiments of the present application is improved.

Figure 12:
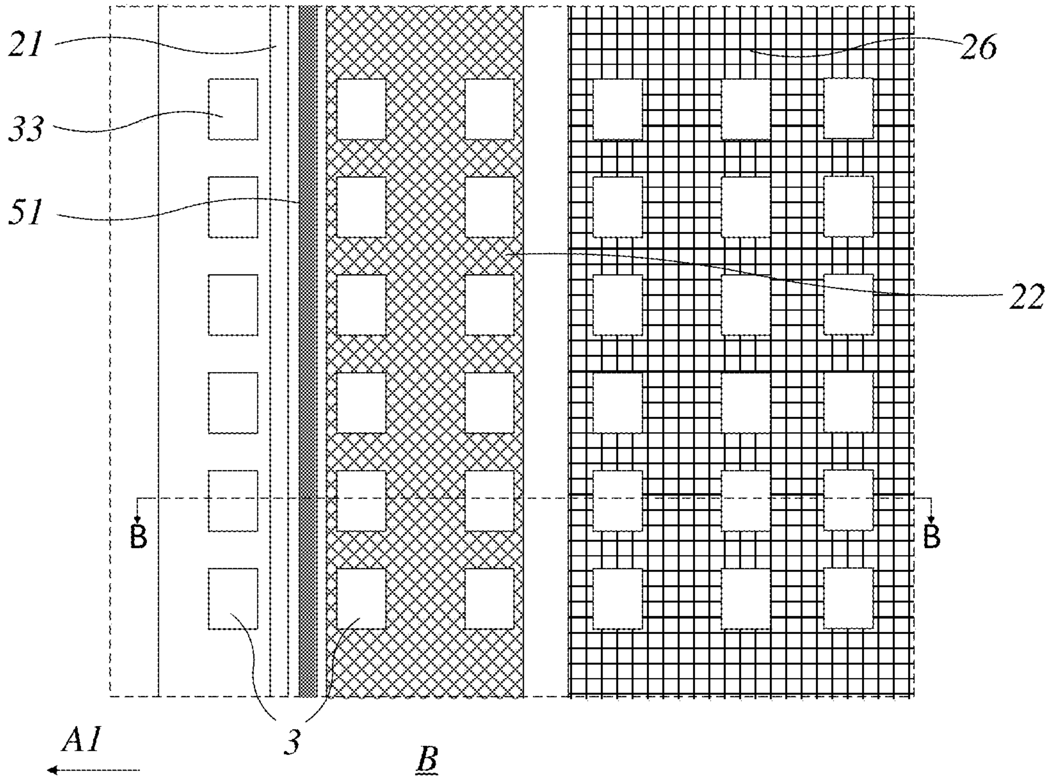
FIG. 12 is another enlarged partial view of region B of the display panel of FIG. 1 according to an embodiment of the present application.
Figure 13:
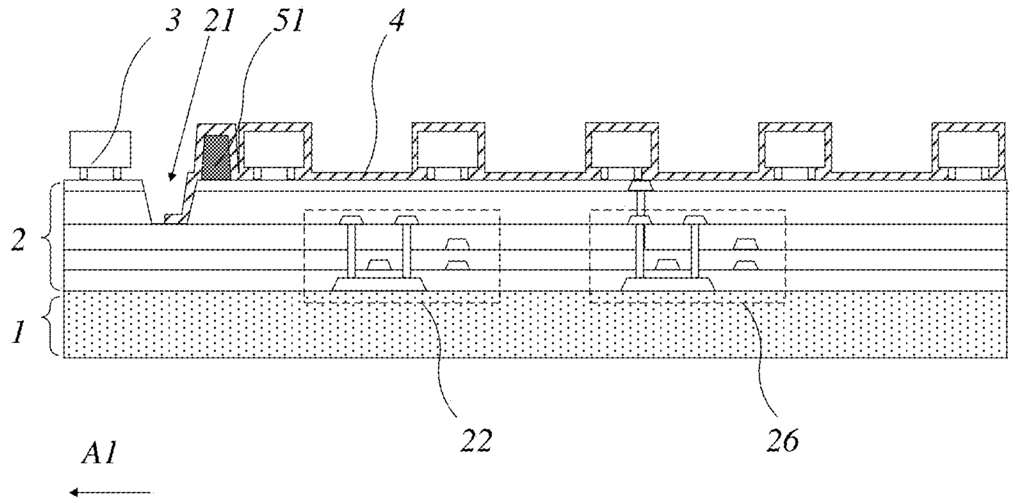
FIG. 13 is another section view taken along section line B-B of FIG. 12 to illustrate region B of the display panel of FIG. 12 according to an embodiment of the present application.
Figure 14:
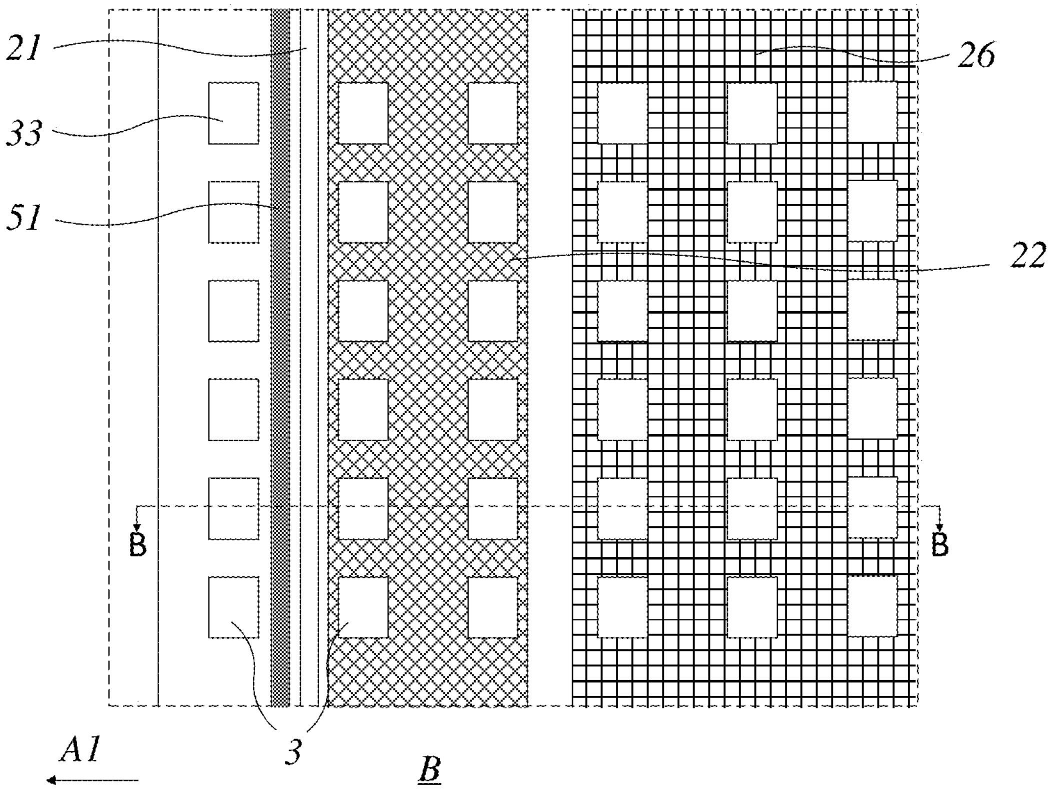
FIG. 14 is another enlarged partial view of region B of the display panel of FIG. 1 according to an embodiment of the present application.
Figure 15:
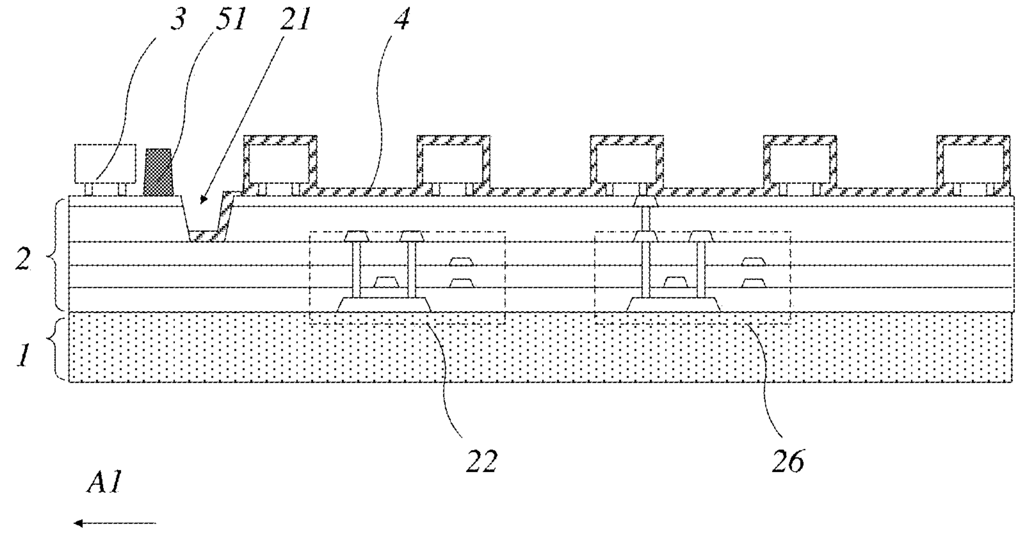
FIG. 15 is another section view taken along section line B-B of FIG. 14 to illustrate region B of the display panel of FIG. 14 according to an embodiment of the present application.

FIG. 12 is another enlarged partial view of region B of the display panel of FIG. 1 according to an embodiment of the present application. FIG. 13 is another section view taken along section line B-B of FIG. 12 to illustrate region B of the display panel of FIG. 12 according to an embodiment of the present application. FIG. 14 is another enlarged partial view of region B of the display panel of FIG. 1 according to an embodiment of the present application. FIG. 15 is another section view taken along section line B-B of FIG. 14 to illustrate region B of the display panel of FIG. 14 according to an embodiment of the present application.

In an embodiment, referring to FIGS. 12 to 15, the display panel includes a first bank 51. The first bank 51 is located on the side of the array layer 2 facing away from the substrate 1. In the first direction A1, the minimum distance from the first bank 51 to the edge of the display panel 101 is less than the minimum distance from the driver circuit 22 to the edge of the display panel 101.

The first bank 51 is located on the side of the array layer 2 facing away from the substrate 1. That is, the first bank 51 protrudes from the surface of the side of the array layer 2 facing away from the substrate 1. In the first direction A1, the minimum distance from the first bank 51 to the edge of the display panel 101 is less than the minimum distance from the driver circuit 22 to the edge of the display panel 101. That is, the first bank 51 is located between the driver circuit 22 and the edge of the display panel 101. Considering that other films may be prepared before the inorganic encapsulation layer 4 is prepared, for example, a light-shielding layer may be prepared before the inorganic encapsulation layer 4 is prepared, the light-shielding layer may be made of an organic material and prepared by printing or coating. When the light-shielding layer is prepared, there is a risk that the organic material of the light-shielding layer may enter the groove 21. The organic material entering the groove 21 may also become an invasion path of water and oxygen, which also severely affects the driver circuit 22. The first bank 51 can reduce the possibility of the entry of materials of other films into the groove 21, so that the inorganic encapsulation layer 4 can contact and be connected to a lower film at the bottom of the groove 21, thereby reducing the impact of the materials of other films on the water and oxygen barrier capability of the inorganic encapsulation layer 4.

Figure 16:
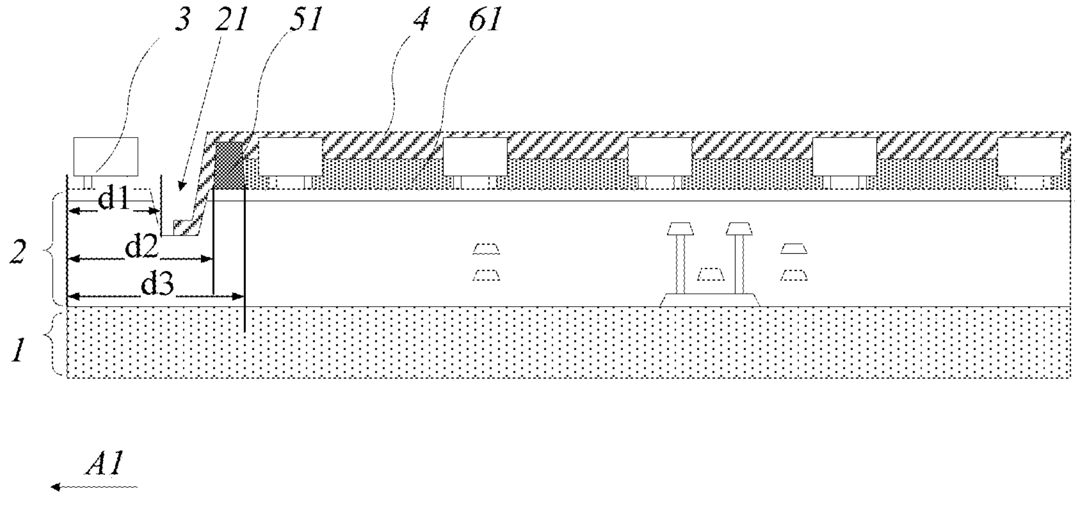
FIG. 16 is another section view taken along section line B-B of FIG. 12 to illustrate region B of the display panel of FIG. 12 according to an embodiment of the present application.

FIG. 16 is another section view taken along section line B-B of FIG. 12 to illustrate region B of the display panel of FIG. 12 according to an embodiment of the present application.

In an embodiment, referring to FIG. 16, the display panel 101 also includes a first light-shielding layer 61. The first light-shielding layer 61 is between the array layer 2 and the inorganic encapsulation layer 4. In the first direction A1, the distance from the groove 21 to the edge of the display panel 101 is d1, the distance from the first bank 51 to the edge of the display panel 101 is d2, and the distance from the edge of the first light-shielding layer 61 to the edge of the display panel 101 is d3, where d1<d2<d3.

In this embodiment of the present application, the first light-shielding layer 61 may include a black matrix or a black adhesive and is configured to absorb light and reduce reflection of ambient light by the bonding film (such as solder) of the array layer 2 or a light emission device. The light absorption rate of the first light-shielding layer 61 should be greater than 85%. The first light-shielding layer 61 is between the array layer 2 and the inorganic encapsulation layer 4. When the display panel 101 of this embodiment of the present application is prepared, the first light-shielding layer 61 is first prepared, and then the inorganic encapsulating layer 4 is prepared.

The distance d1 from the groove 21 to the edge of the display panel 101, the distance d2 from the first bank 51 to the edge of the display panel 101, and the distance d3 from the edge of the first light-shielding layer 61 to the edge of the display panel 101 increase in sequence. That is, the first bank 51 is located between the groove 21 and the edge of the first light-shielding layer 61, and the first bank 51 can block the material of the first light-shielding layer 61 from entering the groove 21, so that the inorganic encapsulation layer 4 can contact and be connected to a lower film at the bottom of the groove 21, thereby reducing the impact of the material of the first light-shielding layer 61 on the water and oxygen barrier capability of the inorganic encapsulation layer 4.

Figure 17:
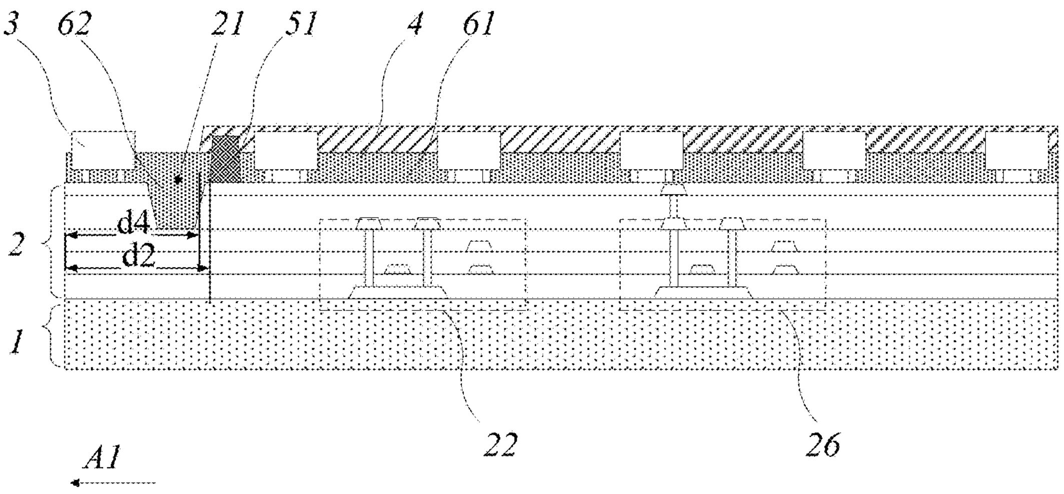
FIG. 17 is another section view taken along section line B-B of FIG. 12 to illustrate region B of the display panel of FIG. 12 according to an embodiment of the present application.

FIG. 17 is another section view taken along section line B-B of FIG. 12 to illustrate region B of the display panel of FIG. 12 according to an embodiment of the present application.

In an embodiment, referring to FIG. 17, the display panel 101 also includes a second light-shielding layer 62. The second light-shielding layer 62 is located on the side of the inorganic encapsulation layer 4 facing away from the substrate 1. The second light-shielding layer 62 at least partially overlaps the groove 21. The distance from the edge of the side of the second light-shielding layer 62 facing away from the edge of the display panel 101 to the edge of the display panel 101 is d4, where d4 is less than or equal to d2.

The material of the second light-shielding layer 62 may be the same as the material of the first light-shielding layer 61. The second light-shielding layer 62 is located on the side of the inorganic encapsulation layer 4 facing away from the substrate 1. When the display panel 101 of this embodiment of the present application is prepared, the inorganic encapsulating layer 4 is first prepared, and then the second light-shielding layer 62 is prepared. The second light-shielding layer 62 is located on the side of the inorganic encapsulation layer 4 facing away from the substrate 1. Even if water vapor may invade through the second light-shielding layer 62, the inorganic encapsulation layer 4 separates the second light-shielding layer 62 from the driver circuit 22. Thus, the driver circuit 22 is basically not affected.

The distance d4 from the edge of the side of the second light-shielding layer 62 facing away from the edge of the display panel 101 to the edge of the display panel 101 is less than or equal to the distance d2 from the first bank 51 to the edge of the display panel 101. The first light-shielding layer 61 can absorb ambient light entering the side of the bank facing away from the edge of the display panel 101. The second light-shielding layer 62 can absorb ambient light entering between the bank and the edge of the display panel 101.

Figure 18:
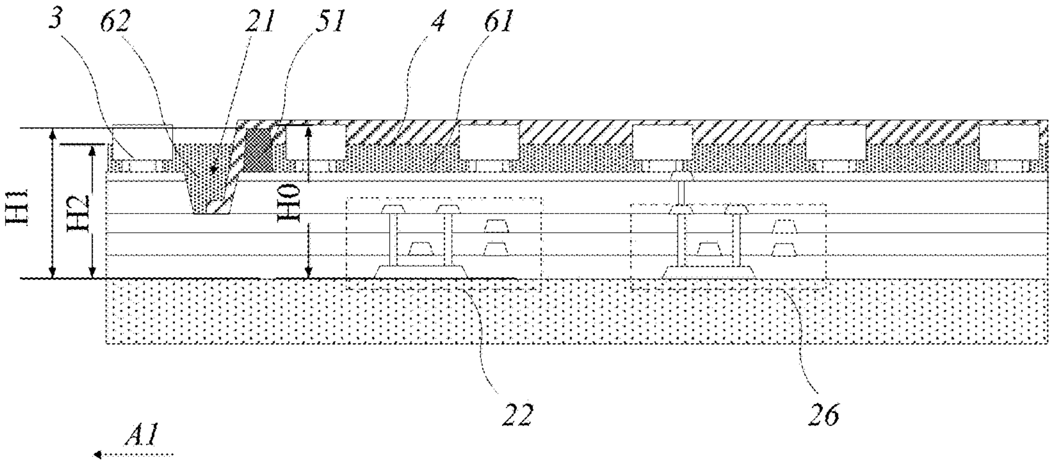
FIG. 18 is another section view taken along section line B-B of FIG. 12 to illustrate region B of the display panel of FIG. 12 according to an embodiment of the present application.

FIG. 18 is another section view taken along section line B-B of FIG. 12 to illustrate region B of the display panel of FIG. 12 according to an embodiment of the present application.

In an embodiment, referring to FIG. 18, the minimum distance from the surface of the side of the light-emitting element facing away from the substrate 1 to the substrate 1 is H0, the distance from the surface of the side of the first bank 51 facing away from the substrate 1 to the substrate 1 is H1, and the distance from the surface of the side of the second light-shielding layer 62 facing away from the substrate 1 to the substrate 1 is H2, where H0>H1>H2.

The minimum distance H0 from the surface of the side of the light-emitting element facing away from the substrate 1 to the substrate 1, the distance H1 from the surface of the side of the first bank 51 facing away from the substrate 1 to the substrate 1, and the distance H2 from the surface of the side of the second light-shielding layer 62 facing away from the substrate 1 to the substrate 1 decrease in sequence. That is, the first bank 51 and the light-emitting element may protrude from the surface of the side of the second light-shielding layer 62 facing away from the substrate 1. At the same time, the light-emitting element is higher than the first bank 51. Thus, the second light-shielding layer 62 and the bank do not significantly affect light emission of the light-emitting element. Similarly, the first light-shielding layer 61 does not significantly affect light emission of the light-emitting element.

Figure 19:
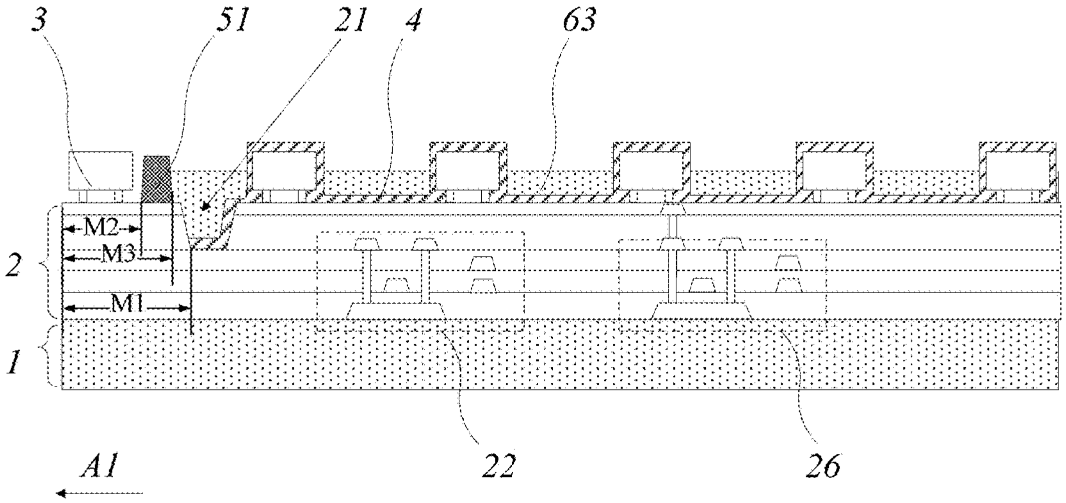
FIG. 19 is another section view taken along section line B-B of FIG. 14 to illustrate region B of the display panel of FIG. 14 according to an embodiment of the present application.

FIG. 19 is another section view taken along section line B-B of FIG. 14 to illustrate region B of the display panel of FIG. 14 according to an embodiment of the present application.

In an embodiment, referring to FIG. 19, the display panel 101 also includes a third light-shielding layer 63. The third light-shielding layer 63 is located on the side of the inorganic encapsulation layer 4 facing away from the substrate 1. The third light-shielding layer 63 at least partially overlaps the groove 21. In the first direction A1, the distance from the groove 21 to the edge of the display panel 101 is M1, the distance from the first bank 51 to the edge of the display panel 101 is M2, and the distance from the edge of the third light-shielding layer 63 to the edge of the display panel 101 is M3, where M1≥M2, and M3>M2.

The third light-shielding layer 63 is located on the side of the inorganic encapsulation layer 4 facing away from the substrate 1. When the display panel 101 of this embodiment of the present application is prepared, the inorganic encapsulating layer 4 is first prepared, and then the third light-shielding layer 63 is prepared. The distance M1 from the groove 21 to the edge of the display panel 101 is greater than or equal the distance M2 from the first bank 51 to the edge of the display panel 101. Thus, the first bank 51 is located between the edge of the display panel 101 and the groove 21. After the inorganic encapsulation layer 4 is prepared, the third light-shielding layer 63 is located on the side of the first bank 51 facing away from the edge of the display panel 101. That is, the distance M3 from the edge of the third light-shielding layer 63 to the edge of the display panel 101 is less than the distance M2 from the first bank 51 to the edge of the display panel 101.

Figure 20:
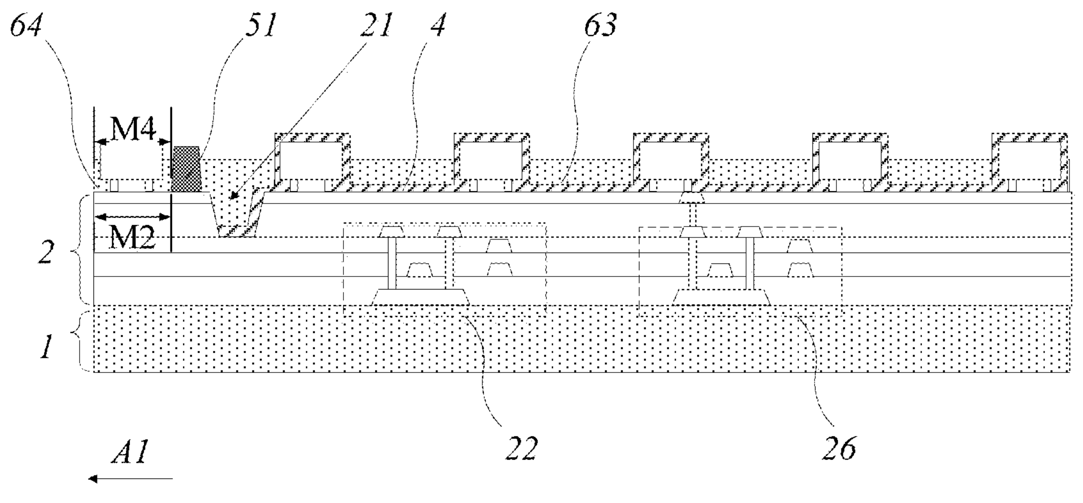
FIG. 20 is another section view taken along section line B-B of FIG. 14 to illustrate region B of the display panel of FIG. 14 according to an embodiment of the present application.

FIG. 20 is another section view taken along section line B-B of FIG. 14 to illustrate region B of the display panel of FIG. 14 according to an embodiment of the present application.

In an embodiment, referring to FIG. 20, the display panel 101 also includes a fourth light-shielding layer 64. The fourth light-shielding layer 64 is between the array layer 2 and the inorganic encapsulation layer 4. The distance from the edge of the side of the fourth light-shielding layer 64 facing away from the edge of the display panel 101 to the edge of the display panel 101 is M4, where M4 is less than or equal to M2.

The fourth light-shielding layer 64 is between the array layer 2 and the inorganic encapsulation layer 4. When the display panel 101 of this embodiment of the present application is prepared, the fourth light-shielding layer 64 is first prepared, and then the inorganic encapsulating layer 4 is prepared. Considering that the first bank 51 is located between the edge of the display panel 101 and the groove 21, the fourth light-shielding layer 64 is located between the first bank 51 and the edge of the display panel 101. Thus, the distance M4 from the edge of the side of the fourth light-shielding layer 64 facing away from the edge of the display panel 101 to the edge of the display panel 101 is less than or equal to the distance M2 from the first bank 51 to the edge of the display panel 101.

Figure 21:
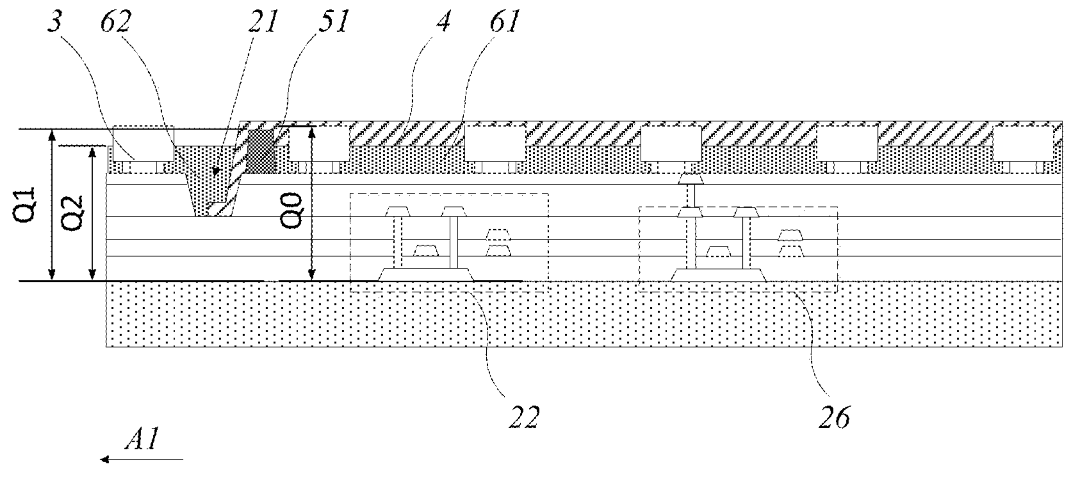
FIG. 21 is another section view taken along section line B-B of FIG. 12 to illustrate region B of the display panel of FIG. 12 according to an embodiment of the present application.

FIG. 21 is another section view taken along section line B-B of FIG. 12 to illustrate region B of the display panel of FIG. 12 according to an embodiment of the present application.

In an embodiment, referring to FIG. 21, the minimum distance from the surface of the side of the light-emitting element facing away from the substrate 1 to the substrate 1 is Q0, the distance from the surface of the side of the first bank 51 facing away from the substrate 1 to the substrate 1 is Q1, and the distance from the surface of the side of the second light-shielding layer 62 facing away from the substrate 1 to the substrate 1 is Q2, where Q0>Q1>Q2.

The minimum distance Q0 from the surface of the side of the light-emitting element facing away from the substrate 1 to the substrate 1, the distance Q1 from the surface of the side of the first bank 51 facing away from the substrate 1 to the substrate 1, and the distance Q2 from the surface of the side of the second light-shielding layer 62 facing away from the substrate 1 to the substrate 1 decrease in sequence. That is, the first bank 51 and the light-emitting element may protrude from the surface of the side of the second light-shielding layer 62 facing away from the substrate 1. At the same time, the light-emitting element is higher than the first bank 51. Thus, the second light-shielding layer 62 and the bank do not significantly affect light emission of the light-emitting element.

Figure 22:
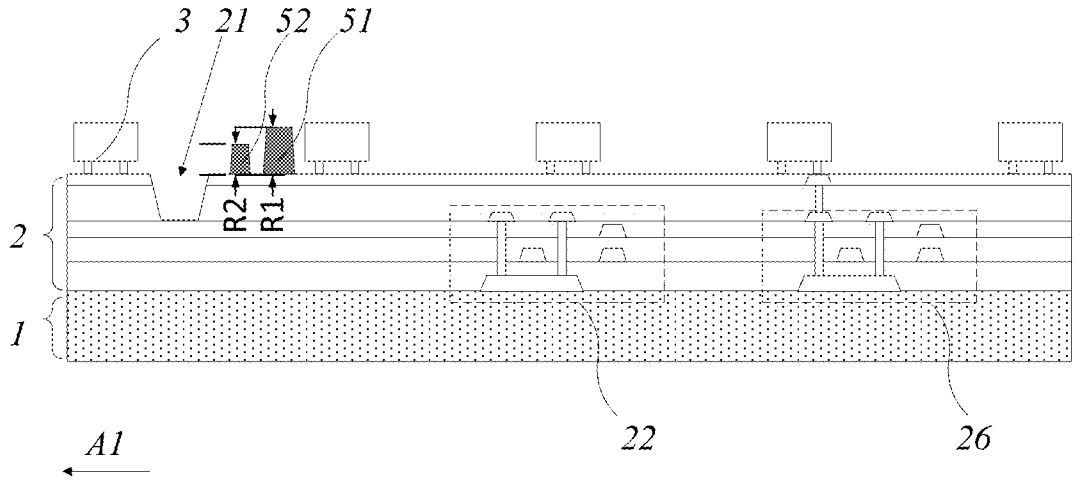
FIG. 22 is another section view taken along section line C-C of FIG. 1 to illustrate region B of the display panel of FIG. 1 according to an embodiment of the present application.

FIG. 22 is another section view taken along section line C-C of FIG. 1 to illustrate region B of the display panel of FIG. 1 according to an embodiment of the present application.

In an embodiment, referring to FIG. 22, the display panel includes a second bank 52. In the first direction A1, the second bank 52 is located between the first bank 51 and the groove 21.

In the first direction A1, the second bank 52 is located between the first bank 51 and the groove 21. When the first light-shielding layer 61 is prepared, a small quantity of materials of the first light-shielding layer 61 may overflow from the first bank 51. The overflowed materials may be blocked by the second bank 52, thereby reducing the possibility of the entry of the material of the first light-shielding layer 61 into the groove 21.

In an embodiment, further referring to FIG. 19, the distance from the surface of the side of the first bank 51 facing away from the substrate 1 to the array layer 2 is R1, the distance from the surface of the side of the second bank 52 facing away from the substrate 1 to the array layer 2 is R2, where R1>R2.

The distance R1 from the surface of the side of the first bank 51 facing away from the substrate 1 to the array layer 2 is greater than the distance R2 from the surface of the side of the second bank 52 facing away from the substrate 1 to the array layer 2. That is, the first bank 51 is higher than the second bank 52. Considering that the second bank 52 is configured to block the material of the first light-shielding layer 61 overflowing from the first bank 51, the height of the second bank 52 may be appropriately reduced. When the second light-shielding layer 62 is prepared, it is also convenient for the material of the second light-shielding layer 62 to be included in the region between the first bank 51 and the second bank 52.

Figure 23:
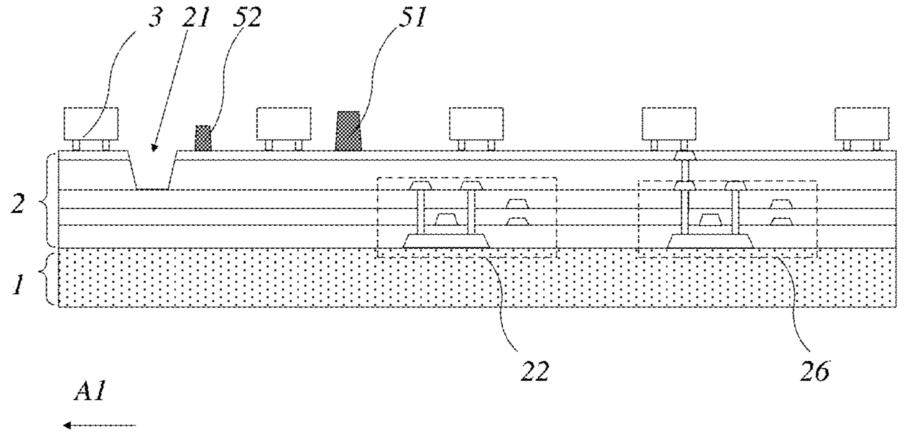
FIG. 23 is another section view taken along section line C-C of FIG. 1 to illustrate region B of the display panel of FIG. 1 according to an embodiment of the present application.

FIG. 23 is another section view taken along section line C-C of FIG. 1 to illustrate region B of the display panel of FIG. 1 according to an embodiment of the present application.

In an embodiment, referring to FIG. 23, in the first direction A1, at least one light-emitting element is located between the first bank 51 and the second bank 52.

At least one light-emitting element may be disposed between the first bank 51 and the second bank 52. Thus, the first bank 51 and the second bank 52 are located in gaps between different light-emitting elements respectively. On the premise of ensuring the arrangement of light-emitting elements, the space between the light-emitting elements is more fully utilized, and the impact on the display effect is reduced.

Figure 24:
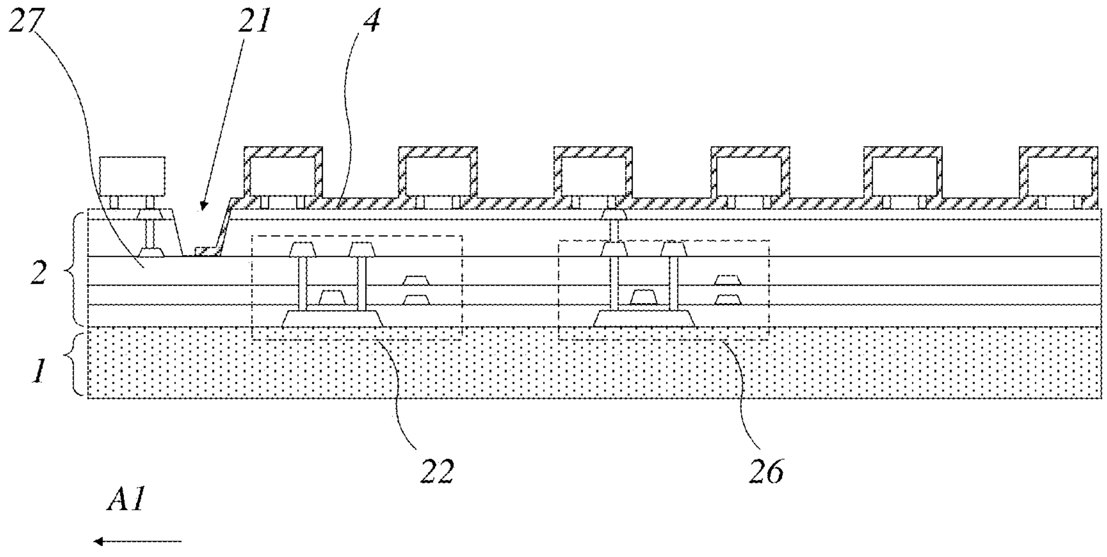
FIG. 24 is another section view taken along section line C-C of FIG. 12 to illustrate region B of the display panel of FIG. 12 according to an embodiment of the present application.

FIG. 24 is another section view taken along section line C-C of FIG. 12 to illustrate region B of the display panel of FIG. 12 according to an embodiment of the present application.

In an embodiment, referring to FIG. 24, the array layer 2 also includes a pixel circuit 26. The driver circuit 22 is located between the pixel circuit 26 and the edge of the display panel 101. The pixel circuit 26 provides a drive current to the floating light-emitting element 33 through a signal connection line 27.

The driver circuit 22 may include an element such as a shift register and is configured to provide a drive signal to the pixel circuit 26. The drive signal should include a scan signal or a light emission signal. The pixel circuit 26 is configured to provide a drive current to the light-emitting element, so that the light-emitting element can emit light. The driver circuit 22 is located between the pixel circuit 26 and the edge of the display panel 101, that is, the region where the driver circuit 22 is located may surround the region where the pixel circuit 26 is located. The floating light-emitting element 33 is electrically connected to the pixel circuit 26 through the signal connection line 27.

Figure 25:
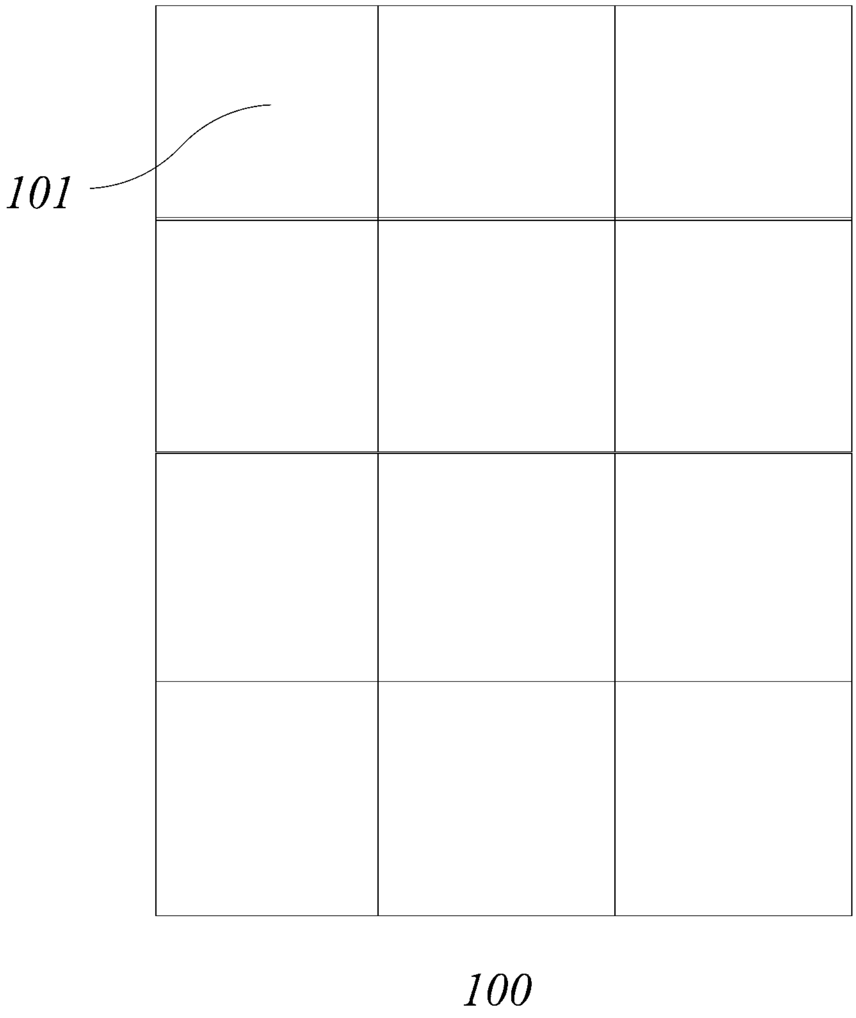
FIG. 25 is a diagram illustrating the structure of a display device according to an embodiment of the present application.

FIG. 25 is a diagram illustrating the structure of a display device according to an embodiment of the present application.

Referring to FIG. 25, an embodiment of the present application provides a display device 100. The display device 100 includes the display panel 101 according to the preceding embodiments of the present application.

It is to be noted that there may be multiple display panels 101 according to the preceding embodiments of the present application. The multiple display panels 101 are arranged in parallel to form a spliced display device 100. It is to be understood that the contact between the two display panels 101 is not in a narrow sense. There may be an unavoidable gap, and the two display panels 101 are considered to be in contact.

Figure 26:
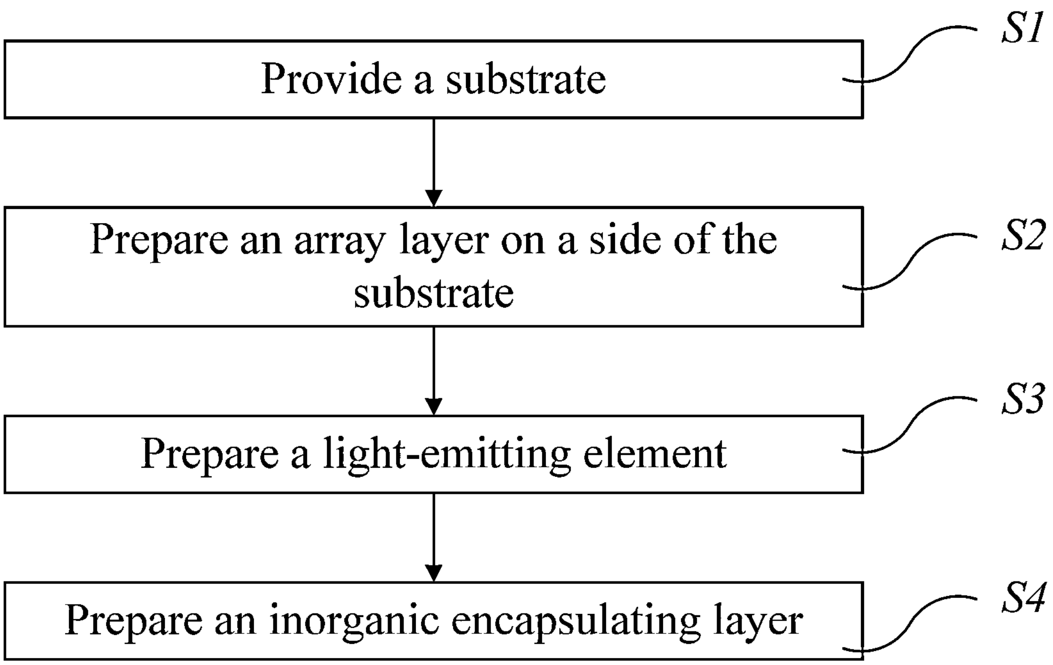
FIG. 26 is a flowchart of a preparing method of a display device according to an embodiment of the present application.

FIG. 26 is a flowchart of a preparing method of a display device according to an embodiment of the present application.

Referring to FIG. 26, an embodiment of the present application provides a method for preparing a display panel 101. The method may be used to prepare the display panel 101 according to the preceding embodiments of the present application. The display panel 101 includes a display region AA.

Specifically, the method for preparing the display panel 101 in this embodiment of the present application includes the steps below.

In step S1, the substrate 1 is provided.

The substrate 1 may be prepared directly, or a finished product of the substrate 1 may be acquired.

In step S2, the array layer 2 is prepared on a side of the substrate 1.

The array layer 2 is prepared in the following manners: The driver circuit 22 is prepared, and the groove 21 is prepared. The driver circuit 22 is at least partially located in the display region AA. In the first direction A1, the minimum distance from the groove 21 to the edge of the display panel 101 is less than the minimum distance from the driver circuit 22 to the edge of the display panel 101. That is, the groove 21 is located between the driver circuit 22 to the edge of the display panel 101. The first direction A1 is the direction in which the display region AA points to the edge of the display panel 101.

In step S3, the light-emitting element is prepared.

The light-emitting element is prepared on the side of the array layer 2 facing away from the substrate 1. There may be multiple light-emitting elements. The multiple light-emitting elements may include light-emitting elements of different colors.

In step S4, the inorganic encapsulating layer 4 is prepared.

The inorganic encapsulation layer 4 is prepared on the side of the light-emitting element facing away from the substrate 1. The inorganic encapsulation layer 4 at least partially covers the groove 21. The inorganic encapsulation layer 4 may cover the bottom of the groove 21 or may cover the sidewall of the groove 21.

Figure 27:
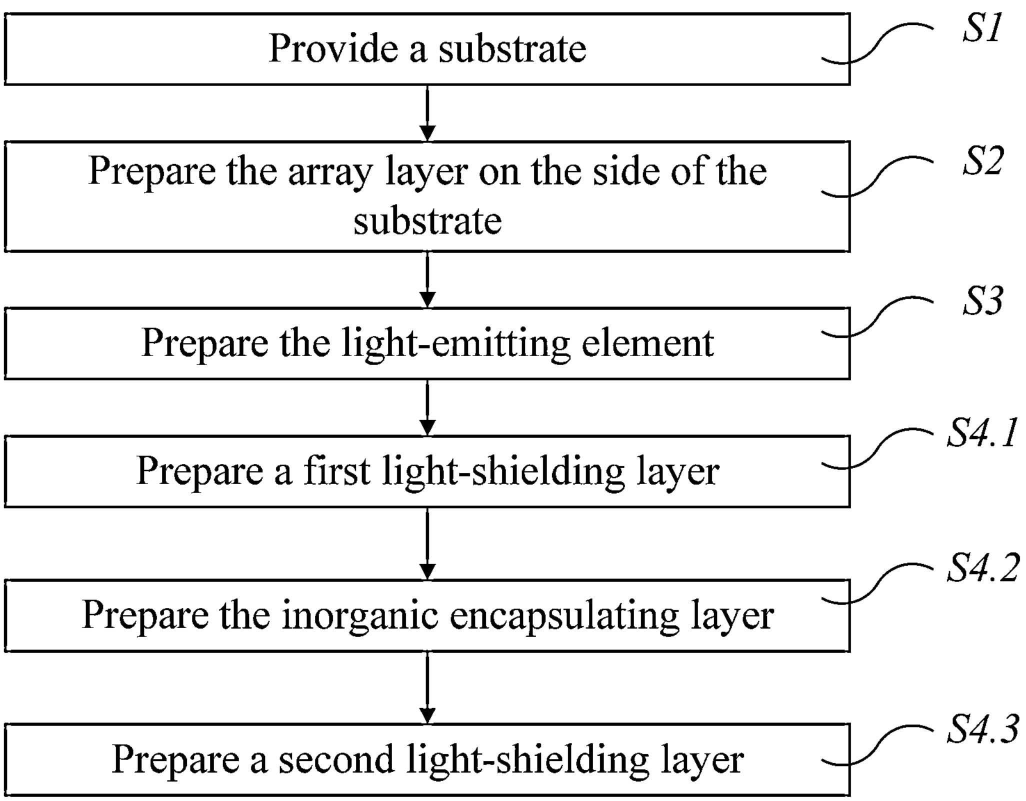
FIG. 27 is a flowchart of a preparing method of a display device according to an embodiment of the present application.

FIG. 27 is another flowchart of a preparing method of a display device according to an embodiment of the present application.

In an embodiment, referring to FIG. 27, step S4 includes the steps below.

In step S4.1, the first light-shielding layer 61 is prepared.

In the first direction A1, the distance from the groove 21 to the edge of the display panel 101 is d1, the distance from the first bank 51 to the edge of the display panel 101 is d2, and the distance from the edge of the first light-shielding layer 61 to the edge of the display panel 101 is d3, where d1<d2<d3. That is, the first light-shielding layer 61 is prepared on the side of the first bank 51 facing away from the edge of the display panel 101.

In step S4.2, the inorganic encapsulating layer 4 is prepared.

The inorganic encapsulation layer 4 covers the groove 21 and the first light-shielding layer 61.

In an embodiment, step S4 also includes the step below.

In step S4.3, the second light-shielding layer 62 is prepared.

The second light-shielding layer 62 at least partially overlaps the groove 21. The distance from the edge of the side of the second light-shielding layer 62 facing away from the edge of the display panel 101 to the edge of the display panel 101 is d4, where d4 is less than or equal to d2. That is, the second light-shielding layer 62 is located between the first bank 51 and the edge of the display panel 101 and is located on the side of the inorganic encapsulation layer 4 facing away from the substrate 1.

Figure 28:
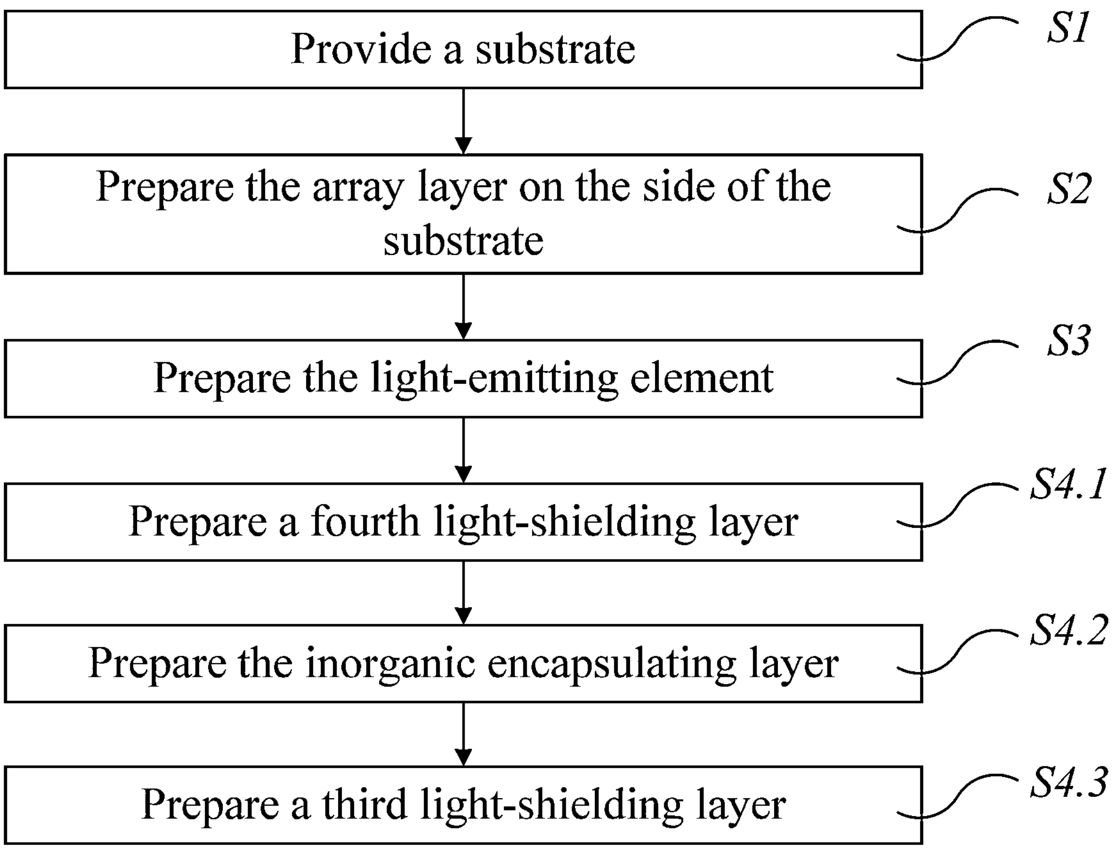
FIG. 28 is a flowchart of a preparing method of a display device according to an embodiment of the present application.

FIG. 28 is another flowchart of a preparing method of a display device according to an embodiment of the present application.

In an embodiment, referring to FIG. 28, step S4 includes the steps below.

In step S4.1, the fourth light-shielding layer 64 is prepared.

In the first direction A1, the distance from the groove 21 to the edge of the display panel 101 is M1, the distance from the first bank 51 to the edge of the display panel 101 is M2, and the distance from the edge of the side of the fourth light-shielding layer 64 facing away from the edge of the display panel 101 to the edge of the display panel 101 is M4, where M1≥M2, and M4≤M2. The first bank 51 is located between the groove 21 and the edge of the display panel 101.

The fourth light-shielding layer 64 is located between the first bank 51 and the edge of the display panel 101.

In step S4.2, the inorganic encapsulating layer 4 is prepared.

The inorganic encapsulation layer 4 covers the groove 21 and the fourth light-shielding layer 64.

In an embodiment, step S4 also includes the step below.

In step S4.3, the third light-shielding layer 63 is prepared.

The distance from the edge of the third light-shielding layer 63 to the edge of the display panel 101 is M3, where M3>M2. That is, the third light-shielding layer 63 is located on the side of the first bank 51 facing away from the edge of the display panel 101. The third light-shielding layer 63 is located on the side of the inorganic encapsulation layer 4 facing away from the substrate 1.

In an embodiment, the light-emitting element includes a floating light-emitting element 33. In the direction perpendicular to the plane where the substrate 1 is located, the orthographic projection of at least one floating light-emitting element 33 is located between the orthographic projection of the driver circuit 22 and the orthographic projection of the edge of the display panel 101.

In this embodiment of the present application, multiple light-emitting elements are disposed in the entire display region AA. The floating light-emitting element 33 has the same structure as other light-emitting elements. In the direction perpendicular to the plane where the substrate 1 is located, the orthographic projection of the floating light-emitting element 33 is located between the orthographic projection of the driver circuit 22 and the orthographic projection of the edge of the display panel 101. The floating light-emitting element 33 may still receive the signals of the driver circuit 22 and the pixel circuit 26 and display and emit light. Thus, the region between the driver circuit 22 and the edge of the display panel 101 can also be a part of the display region AA for display and emitting light. The driver circuit 22 is not disposed below the floating light-emitting element 33, so that a certain distance is left between the driver circuit 22 and the display panel 101 to facilitate the disposition of the groove 21. Thus, the inorganic encapsulation layer 4 can encapsulate the driver circuit 22, so that water and oxygen are prevented from affecting the driver circuit 22.

In summary, in the display panel, the display device, and the method for preparing the display panel provided by the embodiments of the present application, the driver circuit is at least partially located in the display region. Thus, a non-display region is reduced, so that the display panel is in a form of a narrow bezel or no bezel. The groove is located on the outside of the driver circuit to enclose the driver circuit inside. The inorganic encapsulation layer covers the groove and encapsulates the internal region surrounded by the groove. In this manner, the invasion of water and oxygen is blocked, and the impact of the water and oxygen on the driver circuit is reduced. Thus, the display panel of the embodiments of the present application has a good display effect.

In summary, the above are merely preferred embodiments of the present application and are not intended to limit the present application. It is easy for those skilled in the art to conceive of various modifications or substitutions within the technical scope of the present application. These modifications or substitutions are within the scope of the present application. Therefore, the protection scope of the present application is subject to the scope of the claims.

What is claimed is:

1. A display panel, comprising a display region, wherein the display panel further comprises:

a substrate;

an array layer and a light-emitting element, wherein the light-emitting element is located on a side of the array layer facing away from the substrate, the array layer comprises a groove and a driver circuit, and the driver circuit is at least partially located in the display region; and an inorganic encapsulation layer located on a side of the light-emitting element facing away from the substrate, wherein the inorganic encapsulation layer at least partially covers the groove;

wherein in a first direction, a minimum distance from the groove to an edge of the display panel is less than a minimum distance from the driver circuit to the edge of the display panel; and the first direction is a direction in which the display region points to the edge of the display panel.

2. The display panel according to claim 1, wherein the light-emitting element comprises floating light-emitting elements, and in a direction perpendicular to a plane where the substrate is located, an orthographic projection of at least one of the floating light-emitting elements is located between an orthographic projection of the driver circuit and an orthographic projection of the edge of the display panel.

3. The display panel according to claim 2, wherein at least one of the floating light-emitting elements is located between the edge of the display panel and the groove.

4. The display panel according to claim 3, wherein the groove is located between two of the floating light-emitting elements, or none of the floating light-emitting elements is disposed between the groove and the driver circuit.

5. The display panel according to claim 2, wherein in the first direction, at least one first pixel unit is arranged between the edge of the display panel and the driver circuit, and the floating light-emitting elements comprised in a first pixel unit of the at least one first pixel unit have three different colors.

6. The display panel according to claim 5, wherein in the first direction, a length of the first pixel unit is D0, a minimum distance from the driver circuit to the display panel is Dmin, and Dmin≥n×D0, wherein n is a positive integer, or wherein the display panel further comprises a second pixel unit, and light-emitting elements comprised in the second pixel unit have three different colors;

in a direction perpendicular to the substrate, the second pixel unit partially overlaps the driver circuit; and in the first direction, a length of the second pixel unit is D1, a length of the driver circuit is ΔD, and ΔD≥n×D1, wherein n≥1.

7. The display panel according to claim 2, wherein the array layer further comprises a pixel circuit, and the driver circuit is located between the pixel circuit and the edge of the display panel; and wherein the pixel circuit provides a drive current to the floating light-emitting element through a signal connection line.

8. The display panel according to claim 1, wherein the array layer comprises a planarization layer, and the groove penetrates the planarization layer, wherein the array layer further comprises a metal layer and an inorganic insulating layer, and the inorganic encapsulation layer contacts at least one of the metal layer or the inorganic insulating layer at a bottom of the groove adjacent to the substrate.

9. The display panel according to claim 1, comprising a first bank, wherein the first bank is located on the side of the array layer facing away from the substrate, and in the first direction, a minimum distance from the first bank to the edge of the display panel is less than the minimum distance from the driver circuit to the edge of the display panel.

10. The display panel according to claim 9, further comprising a first light-shielding layer, wherein the first light-shielding layer is located between the array layer and the inorganic encapsulation layer; and in the first direction, a distance from the groove to the edge of the display panel is d1, a distance from the first bank to the edge of the display panel is d2, and a distance from an edge of the first light-shielding layer to the edge of the display panel is d3, wherein d1<d2<d3.

11. The display panel according to claim 10, further comprising a second light-shielding layer, wherein the second light-shielding layer is located on a side of the inorganic encapsulation layer facing away from the substrate; and the second light-shielding layer at least partially overlaps the groove, and a distance from an edge of a side of the second light-shielding layer facing away from the edge of the display panel to the edge of the display panel is d4, wherein d4 is less than or equal to d2, wherein a minimum distance from a surface of the side of the light-emitting element facing away from the substrate to the substrate is H0, a distance from a surface of a side of the first bank facing away from the substrate to the substrate is H1, and a distance from a surface of a side of the second light-shielding layer facing away from the substrate to the substrate is H2, wherein H0>H1>H2.

12. The display panel according to claim 11, further comprising a third light-shielding layer, wherein the third light-shielding layer is located on a side of the inorganic encapsulation layer facing away from the substrate; and the third light-shielding layer at least partially overlaps the groove; and wherein in the first direction, a distance from the groove to the edge of the display panel is M1, a distance from the first bank to the edge of the display panel is M2, and a distance from an edge of the third light-shielding layer to the edge of the display panel is M3, wherein M1≥M2, and M3>M2, wherein the display panel further comprises a fourth light-shielding layer, and the fourth light-shielding layer is located between the array layer and the inorganic encapsulation layer; and wherein a distance from an edge of a side of the fourth light-shielding layer facing away from the edge of the display panel to the edge of the display panel is M4, wherein M4 is less than or equal to M2.

13. The display panel according to claim 11, wherein a minimum distance from a surface of the side of the light-emitting element facing away from the substrate to the substrate is Q0, a distance from a surface of a side of the first bank facing away from the substrate to the substrate is Q1, and a distance from a surface of a side of the second light-shielding layer facing away from the substrate to the substrate is Q2, wherein Q0>Q1>Q2.

14. The display panel according to claim 9, further comprising a second bank, wherein in the first direction, the second bank is located between the first bank and the groove, wherein a distance from a surface of a side of the first bank facing away from the substrate to the array layer is R1, and a distance from a surface of a side of the second bank facing away from the substrate to the array layer is R2, wherein R1>R2, and wherein in the first direction, at least one light-emitting element is located between the first bank and the second bank.

15. A display device, comprising a display panel, wherein the display panel comprises a display region, wherein the display panel further comprises:

a substrate;

an array layer and a light-emitting element, wherein the light-emitting element is located on a side of the array layer facing away from the substrate, the array layer comprises a groove and a driver circuit, and the driver circuit is at least partially located in the display region; and an inorganic encapsulation layer located on a side of the light-emitting element facing away from the substrate, wherein the inorganic encapsulation layer at least partially covers the groove;

wherein in a first direction, a minimum distance from the groove to an edge of the display panel is less than a minimum distance from the driver circuit to the edge of the display panel; and the first direction is a direction in which the display region points to the edge of the display panel.

16. A method for preparing a display panel, wherein the display panel comprises a display region; and wherein the preparing method comprises:

providing a substrate;

preparing an array layer on a side of the substrate, wherein the preparing the array layer comprises preparing a driver circuit and preparing a groove, and at least a part of the driver circuit is located in the display region;

preparing a light-emitting element on a side of the array layer facing away from the substrate; and preparing an inorganic encapsulation layer on a side of the light-emitting element facing away from the substrate, wherein the inorganic encapsulation layer at least partially covers the groove;

in a first direction, a minimum distance from the groove to an edge of the display panel is less than a minimum distance from the driver circuit to the edge of the display panel; and the first direction is a direction in which the display region points to the edge of the display panel.

17. The method for preparing a display panel according to claim 16, further comprising:

preparing a first bank on a side of the array layer facing away from the substrate;

wherein in the first direction, a minimum distance from the first bank to the edge of the display panel is less than the minimum distance from the driver circuit to the edge of the display panel.

18. The method for preparing a display panel according to claim 17, wherein after preparing the light-emitting element, and before preparing the inorganic encapsulation layer, the preparing method further comprises:

preparing a first light-shielding layer;

wherein in the first direction, a distance from the groove to the edge of the display panel is d1, a distance from the first bank to the edge of the display panel is d2, and a distance from an edge of the first light-shielding layer to the edge of the display panel is d3, wherein d1<d2<d3, and wherein after preparing the inorganic encapsulation layer, the preparing method further comprises:

preparing a second light-shielding layer;

wherein the second light-shielding layer at least partially overlaps the groove, and a distance from an edge of a side of the second light-shielding layer facing away from the edge of the display panel to the edge of the display panel is d4, wherein d4 is less than or equal to d2.

19. The method for preparing a display panel according to claim 17, wherein after preparing the light-emitting element, and before preparing the inorganic encapsulation layer, the preparing method further comprises:

preparing a fourth light-shielding layer is prepared;

wherein in the first direction, a distance from the groove to the edge of the display panel is M1, a distance from the first bank to the edge of the display panel is M2, and a distance from an edge of a side of the fourth light-shielding layer facing away from the edge of the display panel to the edge of the display panel is M4, wherein M1≥M2, and M4≤M2, and wherein after preparing the inorganic encapsulation layer, the preparing method further comprises:

preparing a third light-shielding layer;

wherein a distance from an edge of the third light-shielding layer to the edge of the display panel is M3, wherein M3>M2.

20. The method for preparing a display panel according to claim 16, wherein the light-emitting element comprises floating light-emitting elements, in a direction perpendicular to a plane where the substrate is located, an orthographic projection of at least one floating light-emitting elements is located between an orthographic projection of the driver circuit and an orthographic projection of the edge of the display panel.

* * * * *